(12) United States Patent
Du

(10) Patent No.: US 8,089,278 B1
(45) Date of Patent: Jan. 3, 2012

(54) TIME-RESOLVED CONTRAST-ENHANCED MAGNETIC RESONANCE (MR) ANGIOGRAPHY

(75) Inventor: Jiang Du, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 296 days.

(21) Appl. No.: 12/422,847

(22) Filed: Apr. 13, 2009

Related U.S. Application Data

(60) Provisional application No. 61/044,155, filed on Apr. 11, 2008.

(51) Int. Cl.
*G01V 3/00* (2006.01)
(52) U.S. Cl. .......................................... 324/307
(58) Field of Classification Search .......... 324/300–322; 600/410–435
See application file for complete search history.

(56) References Cited

U.S. PATENT DOCUMENTS 7,602,184 B2 * 10/2009 Du ................................ 324/309

OTHER PUBLICATIONS

Aldefeld et al., "Effects of gradient anisotropy in MRI," *Magn Reson Med*, 39:606-614 (1998).
Amann et al., "Three-dimensional spiral MR imging: application to renal multiphase contrast-enhanced angiography," *Magn Reson Med*, 48:290-296 (2002).
Barger et al., "Time-resolved contrast-enhanced imaging with isotropic resolution and broad coverage using an undersampled 3D projection trajectory," *Magn Reson Med*, 48:297-305 (2002).
Bydder et al., "Partial Fourier Partially Parallel Imaging," *Magn Reson Med*, 53:1393-1401 (2005).
Carr et al., "Time-resolved three-dimensional pulmonary MR angiography and perfusion imaging with ultrashort repetition time," *Acad Radiol*, 9:1407-1418 (2002).
Carroll, "The emergence of time-resolved contrast-enhanced MR imaging for intracranial angiography," *AJNR Am J Neuroradiol*, 23:346-348 (2002).
Cashen et al., "Intracranial time-resolved contrast-enhanced MR angiography at 3T," *AJNR Am J Neuroradial*, 27:822-829 (2006).
Chandra et al., "Application of reduced-encoding imaging with generalized-series reconstruction (RIGR) in dynamic MR imaging," *J Magn Reson Imaging*, 6:783-797 (1996).
Du et al., "Time-resolved, undersampled projection reconstruction imaging for high resolution CE MRA of the distal runoff vessels," *Magn Reson Med*, 48:516-522 (2002).
Du et al., "Contrast Enhanced Peripheral Magnetic Resonance Angiography Using Time-Resolved Vastly Undersampled Isotropic Projection Reconstruction," *J. Magnetic Resonance Imaging*, 20:894-900 (2004).

(Continued)

*Primary Examiner* — Dixomara Vargas
(74) *Attorney, Agent, or Firm* — Perkins Coie LLP

(57) ABSTRACT

The techniques and systems described in this application can be used to, in one implementation, optimize data acquisition including sampling trajectories and undersampling factors. A method performed by a nuclear magnetic resonance imaging (MRI) system comprises applying a gradient and a radio frequency pulse sequence to an imaging target to partition a three-dimensional (3D) Cartesian k-space into a plurality of half projections in a ky-kz plane, the plurality of half projections divided into a plurality of interleaves, each interleave comprising one or more of the half projections and providing an asymmetric radial sampling of the ky-kz plane. Magnetic resonance signals are acquired to sample phase and slice encodings along each of the plurality of half projections. The magnetic resonance signal is processed to reconstruct at least one dynamic frame of the imaging subject to provide 3D volumetric imaging of contrast dynamics.

25 Claims, 16 Drawing Sheets

OTHER PUBLICATIONS

Du et al., "High resolution time-resolved contrast-enhanced MR abdominal and pulmonary angiography using a spiral-TRICKS sequence," *Magn Reson Med*, 58:631-635 (2007).
Duyn et al., "Simple correction method for k-space trajectory deviations in MRI," *J Magn Reson*, 132:150-153 (1998).
Earls et al., "Breath-hold single-dose gadolinium-enhanced three-dimensional MR aortography: usefulness of a timing examination and MR power injector," *Radiology*, 201:705-710 (1996).
Fink et al., "Time-resolved contrast-enhanced three-dimensional magnetic resonance angiography of the chest: combination of parallel imaging with view sharing (TREAT)," *Invest Radiol*, 40:40-48 (2005).
Foo et al., "High-spatial-resolution multistation MR imaging of lower-extremity peripheral vascular with segmented volume acquisition: feasibility study," *Radiology*, 219:835-841 (2001).
Griswold et al., "Generalized autocalibrating partially parallel acquisitions (GRAPPA)," *Magn Reson Med*, 47:1202-1210 (2002).
Hany et al., "Aorta and runoff vessels: single-injection MR angiography with automated table movement compared with multiinjection time-resolved MR angiography—initial results," *Radiology*, 221:266-272 (2001).
Jones et al., "K-space substitution: a novel dynamic imaging technique," *Magn Reson Med*, 29:830-834 (1993).
Joseph et al., "Experimental simulation evaluation of ECG-gated heart scans with a small number of views," *Med Phys*, 10:444-449 (1983).
Korosec et al., "Time-resolved contrast-enhanced 3D MR angiography," *Magn Reson Med*, 36:345-351 (1996).
Kozerke et al., "Accelerating cardiac cine 3D imaging using k-t BLAST," Magn Reson Med, 52:19-26 (2004).
Lee et al., "Fast 3D imaging using variable-density spiral trajectories with applications to limb perfusion," *Magn Reson Med*, 50:1276-1285 (2003).
Madhuranthakam et al., "Undersampling elliptical centric view-order for improved spatial resolution in contrast-enhanced MR angiography," *Magn Reson Med*, 55:50-58 (2006).
Maki et al., "The effects of time varying intravascular signal intensity and k-space acquisition order on three-dimensional MR angiography image quality," *J Magn Reson Imaging*, 6:642-651 (1996).
Mazaheri et al., "Combined time-resolved and high-spatial-resolution 3D MRA using an extended adaptive acquisition," *J Magn Reson Imaging*, 15:291-301 (2002).
Mende et al., "Time-resolved, high-resolution contrast-enhanced MR angiography of dialysis shunts using the CENTRA Keyhole technique with parallel imaging," *J Magn Reson Imaging*, 25:832-840 (2007).
Mistretta et al., "Highly constrained backprojection for time-resolved MRI," *Magn Reson Med*, 55:30-40 (2006).
Nael et al., "Contrast-enhanced MR angiography at 3T in the elevation of intracranial aneurysms: a comparison with time-of-flight MR angiography," *AJNR Am J Neuroadiol*, 27:2118-2121 (2006).
Noll et al., "Homodyne Detection in Magnetic Resonance Imaging," *IEEE Trans Med Imag*, 10: 154-163 (1991).
Ozsarlak et al., "Angiography of the intracranial vessels: technical aspects and clinical applications," *Neuroradiology*, 46:955-972 (2004).
Peters et al., "Centering the projection reconstruction trajectory: reducing gradient delay errors," *Magn Reson Med*, 50:1-6 (2003).
Peters et al., "Undersampled projection reconstruction applied to MR angiography," *Magn Reson Med*, 43:91-101 (2000).
Prince, M.R. et al., *3D Contrast-Enhanced MR Angiography*, New York, NY: Springer-Verlag, references to "k-space" found on pp. 1, 6, 12-15, 17, 18, 20, 25, 32, 44, 47-49, 52, 54-60, 62, 63, 73, 77, 81, 82, 84, 88, 89, 106, 108, 109, 124, 127, 128, 134, 140, 149, 151, 158, 160, 162, 164, 166, 167, 170, 172, 175-178, 180, 181, 183, 188, 190, 192-196, 220, 222, 224, 230, 231, 235, 236, 238, 241 and 244 (2003).
Pruessman et al., "Advances in Sensitivity Encoding With Arbitrary k-Space Trajectories," *Magn Reson Med*, 46:638-651 (2001).
Schoenberg et al., "Renal arteries: optimization of three-dimensional Gadolinium-enhanced MR Angiography with bolus-timing-independent fast multiphase acquisition in a single breath hold," *Radiology*, 211:667-679 (1999).
Song et al., "Dynamic MRI with projection reconstruction and KWIC processing for simultaneous high spatial and temporal resolution," *Magn Reson Med*, 52:815-824 (2004).
Song et al., "k-Space weighted image contrast (KWIC) for contrast manipulation in projection reconstruction MRI," *Magn Reson Med*, 44:825-832 (2000).
Tsao et al., "k-t BLAST and k-t Sense: dynamic MRI with high frame rate exploiting spatiotemporal correlations," *Magn Reson Med*, 50:1031-1042 (2003).
van Vaals et al., ""Keyhole" method for accelerating imaging of contrast agent update," *J Magn Reson Imaging*, 3:671-675 (1993).
Vigen et al., "Undersampled projection reconstruction imaging for time-resolved contrast-enhanced imaging," *Magn Reson Med*, 43:170-176 (2000).
Willinek et al., "Randomly segmented central k-space ordering in high-spatial-resolution contrast-enhanced MR angiography of the supraaortic arteries: initial experience," *Radiology*, 225:583-588 (2002).
Wilman et al., "Fluoroscopically triggered contrast-enhanced three-dimensional MR angiography with elliptical centric view order: application to the renal arteries," *Radiology*, 205:137-146 (1997).
Zhu et al., "High temporal and spatial resolution 4D MRA using spiral data sampling and sliding window reconstruction," *Magn Reson Med*, 52:14-18 (2004).

* cited by examiner

TIME-RESOLVED CONTRAST-ENHANCED MAGNETIC RESONANCE (MR) ANGIOGRAPHY

CLAIM OF PRIORITY

This application claims priority under 35 U.S.C. §119(e) to U.S. Patent Application Ser. No. 61/044,155, filed on Apr. 11, 2008, the entire contents of which are incorporated by reference as part of the specification of this application.

BACKGROUND

This application relates to magnetic resonance imaging (MRI).

Imaging through MRI techniques is well known and has been widely applied in imaging applications in medical, biological and other fields. A typical MRI technique produces an image of an object under examination by manipulating the magnetic spins in the object and processing measured responses from the magnetic spins. An MRI system may include hardware to generate different magnetic fields for imaging, including a static magnetic field along a z-direction to polarize a portion of the magnetic spins, magnetic field gradients (e.g., along mutually orthogonal x, y, or z directions), and RF magnetic fields to manipulate the spins.

SUMMARY

Techniques, apparatus and systems are described for magnetic resonance imaging. Time Resolved Interleaved Projection sampling with three-dimensional (3D) Cartesian Phase and Slice encoding (TRIPPS) is based on a clinical 3D spoiled gradient echo sequence. Data sampling follows predefined center out radial trajectories, or zig-zag trajectories (to avoid regridding) in the ky-kz plane. The non-sampled views are accounted for by zero-filling, view sharing, and/or use of a 2D homodyne reconstruction. The TRIPPS technique combines the robustness of Cartesian imaging and efficiency of undersampled PR acquisition, and is expected to provide 3D CE-MRA with both high spatial resolution and high temporal resolution.

In one aspect, a method performed by a nuclear magnetic resonance imaging (MRI) system comprises applying a gradient and a radio frequency pulse sequence to an imaging target to partition a three-dimensional (3D) Cartesian k-space into half projections in a ky-kz plane, the half projections divided into interleaves, each interleave comprising one or more of the half projections and providing an asymmetric radial sampling of the ky-kz plane. The method includes acquiring magnetic resonance signals to sample phase and slice encodings along each of the half projections. In addition, the method includes processing the acquired magnetic resonance signals to reconstruct at least one dynamic frame of the imaging target to provide 3D volumetric imaging of contrast dynamics.

Implementations can optionally include one or more of the following features. Processing the acquired magnetic resonance signals can include applying a 3D fast Fourier transformation reconstruction on the acquired magnetic resonance signals. Processing the acquired magnetic resonance signals can include applying a view sharing sliding window filter to obtain central k-space data from a current dynamic frame and sharing outer k-space data with neighboring interleaves. Sharing the outer k-space data can include changing a width of a time window to share data from different spatial frequencies in the ky-kz plane. Applying the view sharing sliding window filter can include using zero-filling to compensate for any missing data. Applying the view sharing sliding window filter can include applying homodyne reconstruction to compensate for asymmetric undersampling. Processing the acquired magnetic resonance signals can include applying iterative least square parallel image reconstruction to partially replace spatial encoding imparted by magnetic field gradients with localized receive fields of a phased array coil. Also, processing the acquired magnetic resonance signals can include applying highly constrained backprojection reconstruction comprising generating a composite image through a combination of a series of dynamic data comprising multiple time frames. Applying the highly constrained backprojection reconstruction can also include generating a weighting image through backprojection of the series of dynamic data, and multiplying the generated weighting image with the composite image to generate dynamic images.

In another aspect, instructions, stored tangibly in a machine-readable medium, are operable to cause one or more hardware components of a magnetic resonance imaging system to perform the methods described above.

In another aspect, a system for magnetic resonance imaging (MRI) comprises a scanner comprising a magnet, gradient coils and a radio frequency system to apply a gradient and a radio frequency pulse sequence to an imaging target to partition a three-dimensional (3D) Cartesian k-space into half projections in a ky-kz plane, the half projections divided into interleaves, each interleave comprising one or more of the half projections and providing an asymmetric radial sampling of the ky-kz plane. The scanner also acquires magnetic resonance signals to sample phase and slice encodings along each of the plurality of half projections. The MRI system also includes a data processing system in communication with the scanner to receive the acquired magnetic resonance signals and process the received magnetic resonance signals to reconstruct at least one dynamic frame of the imaging target to provide 3D volumetric imaging of contrast dynamics.

Implementations can optionally include one or more of the following features. 25. The gradient and the radio frequency pulse sequence can include an asymmetric SINC pulse and a slab selection gradient to perform 3D volumetric excitation; and a phase encoding gradient (Gy), a slice encoding gradient (Gz) and a frequency encoding gradient (Gx) to obtain spatial localization.

The techniques and systems described in this specification can potentially provide at least one of the following advantages. For example, the techniques and systems can be used to provide a fast and robust 3D dynamic imaging sequence. Also, dynamic imaging reconstruction algorithms can be implemented to efficiently suppress undersampling artifacts and improve image SNR and CNR.

DETAILED DESCRIPTION

Figure 1:
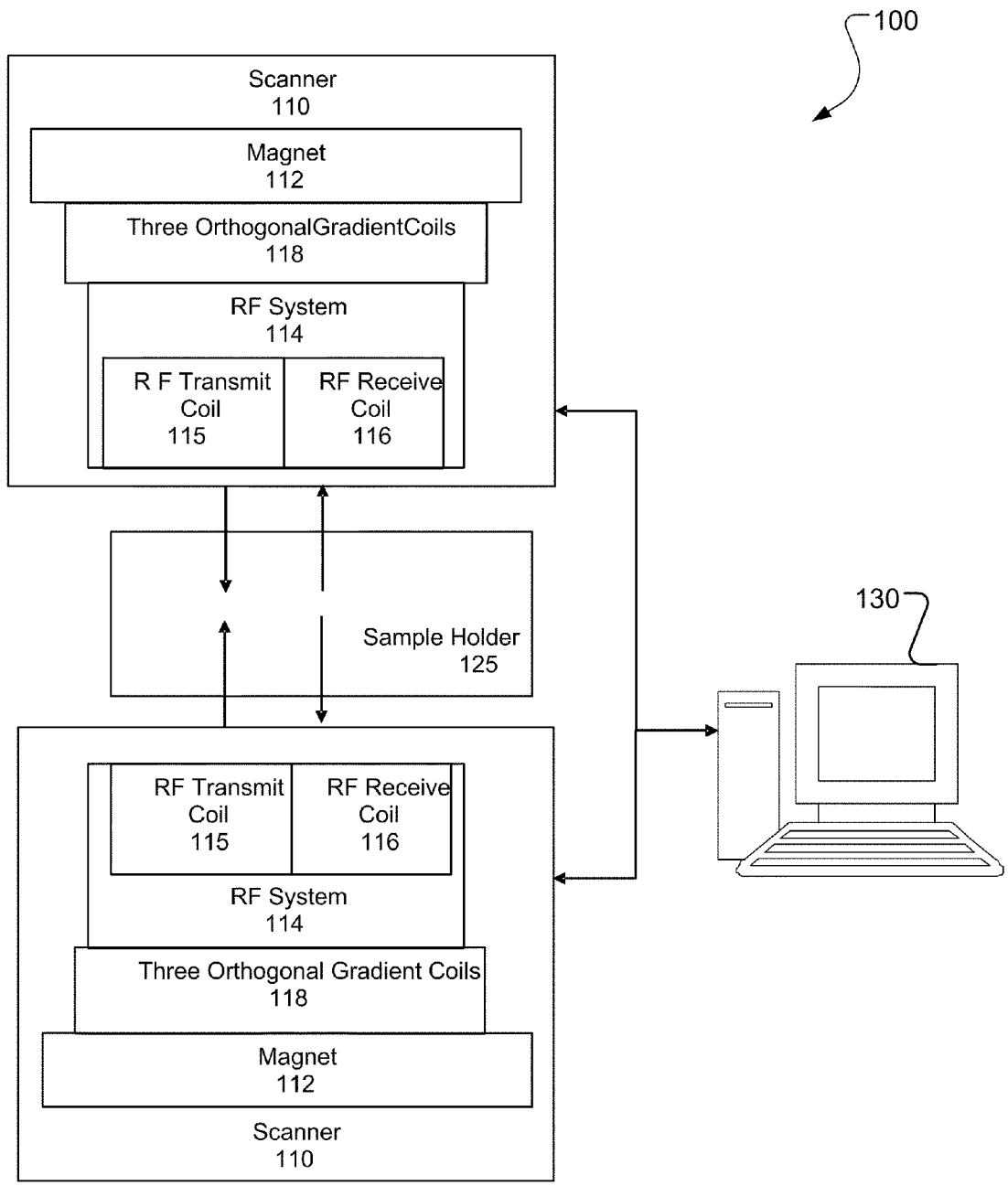
FIG. 1 shows an example MRI system.

Approaches for dynamic imaging include Cartesian-based and projection reconstruction (PR) acquisitions. Cartesian acquisitions, such as Key-hole and time resolved imaging of the contrast kinetics (TRICKS), can provide robust imaging of contrast dynamics. However, in some implementations, the dynamic information is limited to low spatial frequencies in Key-hole imaging. With TRICKS the temporal resolution is traded for spatial resolution. For example, in breath-hold imaging where the time during which TRICKS k-space segments can be obtained is constrained, the number of views per segment is reduced to maintain temporal resolution. Higher temporal and spatial resolution images can, in some implementations, be achieved through undersampled PR acquisitions, such as PR-TRICKS, vastly undersampled isotropic projection reconstruction (VIPR), or highly constrained backprojection reconstruction (HYPR) with an acceleration factor ranging from 5 to 100 or more over the conventional Cartesian imaging. However, PR trajectories can be sensitive to gradient errors due to eddy currents and gradient anisotropy, and off-resonance due to B0 field inhomogeneity and susceptibility.

TRICKS is a method of imaging contrast dynamics based on 3D Cartesian spoiled gradient echo acquisition. In an example implementation of TRICKS, k-space is typically partitioned into three regions (A, B and C regions) from low spatial frequency (A region) to high spatial frequencies (B and C regions). The A region, for example, may be sampled more frequently than B and C regions. An example sampling order is $A_1B_2A_3C_4A_5B_6A_7C_8$, where the subscript refers to the sampling order or time frame. Nearest neighbor interpolation can be used to reconstruct dynamic images for each time frame.

Undersampled projection reconstruction (PR) acquisition provides oversampling of the kspace center, where most of the k-space energy is centered there, and allows undersampling of the k-space periphery to speed up the acquisition with reasonable undersampling streak artifact. Higher acceleration factor has been reported for 3D PR acquisition, such as Vastly undersampled Isotropic Projection Reconstruction (VIPR), and for the HighlY constrained backProjection Reconstruction (HYPR) technique described below. In some cases, PR-type techniques are highly sensitive to gradient errors (such as gradient anisotropy, non-linearity and eddy currents) and offresonance effects.

Spiral acquisition allows long readout per TR and shorter echo time due to its center out sampling strategy. Fewer number of spiral interleaves can cover the whole k-space, providing a significant speed up factor. The combination of spiral trajectory with strategies, such as variable density, interleaved acquisition, or TRICKS slice acquisition scheme, can further enhance the acceleration factor over conventional multiphase Cartesian 3D imaging. However, spiral type acquisition is sensitive to gradient errors and off-resonance effects in some implementations. The robustness of spiral-based techniques may be improved by analyzing gradient measurements and field mapping.

Cartesian-based acquisitions provide robust dynamic images which are largely immune to gradient errors and off-resonance effects, and PR-based acquisitions are able to generate very fast dynamic images through undersampling. The techniques and systems described in this specification combine the robustness of Cartesian imaging with the high time efficiency of undersampled PR acquisitions for time-resolved CE-MRA.

The techniques and systems described in this specification can be used to perform time-resolved imaging that allows rapid acquisition of multiple 3D volumes throughout the passage of the contrast bolus and resolve the errors due to bolus timing, inter-patient variability, asymmetric or delayed filling of the contrast material. A Time Resolved Interleaved Projection sampling is implemented with 3D Cartesian Phase and Slice encoding (TRIPPS), which is based on a clinical 3D spoiled gradient echo sequence. Data sampling follows predefined center out radial trajectories, or zig-zag trajectories (to avoid regridding) in the ky-kz plane. The non-sampled views are accounted for by zero-filling, view sharing, and/or use of a 2D homodyne reconstruction. The TRIPPS technique combines the robustness of Cartesian imaging and efficiency of undersampled PR acquisition to provide 3D CE-MRA with both high spatial resolution and high temporal resolution.

Implementations of the TRIPPS technique include developing and optimizing the TRIPPS data acquisition and image reconstruction schemes on a flow phantom. For example, a TRIPPS pulse sequence can be generated to optimize data acquisition including sampling trajectories and undersampling factors. In addition, dynamic imaging reconstruction techniques can be implemented to maximize signal and contrast and minimizing undersampling artifacts.

The TRIPPS acquisition and image reconstruction techniques can be evaluated on asymptomatic volunteers and patients. This can be achieved through TRIPPS imaging of the pulmonary, renal and intracranial vasculature of asymptomatic volunteers and patients.

FIG. 1 shows an example MRI system 100. The techniques as disclosed in this specification can be implemented using the MRI system 100, for example. The MRI system 100 includes a scanner 110, a data processing apparatus 130 and a sample holder or table 125 for holding a sample 120. The scanner 110 can be implemented using any one of various MRI scanners including a 1.5 T Sigma TwinSpeed scanner and a 3T Sigma TwinSpeed scanner (available from GE Healthcare Technologies, Milwaukee, Wis.) The scanner 110 includes a main magnet 112, three orthogonal gradient coils 118 and a RF system 114. The main magnet 112 is designed to provide a constant, homogeneous magnetic field. The three orthogonal gradient coils 118 are designed to provide three orthogonal, controller magnetic gradients used to acquire image data of a desired slice by generating an encoded and slice-selective magnetic field. The RF system 114 includes a RF transmit coil 115 and a RF receive coil designed to transmit and receive RF pulses. The RF system 145 can further include a RF synthesizer (not shown) and a power amplifier (not shown). In some implementations, an integrated transceiver coil (not shown) can be implemented instead of the separate transmit coil 115 and receive coil 116 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

K-Space Sampling

TRIPPS is an example dynamic imaging technique based on a clinical 3D spoiled gradient echo sequence. The 3D Cartesian k-space is partitioned into multiple half projections in the ky-kz plane. The phase and slice encodings are sampled along the predefined center-out radial trajectories. The whole set of half projections is divided into 12 or more interleaves. Each interleave has an odd number of half projection (such as 15 or 29), creating an asymmetric radial sampling of the ky-kz space for improved streak artifact reduction. The central phase/slice encodings (such as 100) are sampled for each interleave, regardless of the pre-defined radial trajectories for improved artifact control. High frequency phase and slice encoding data are shared among the neighboring interleaves, similar to the view sharing strategy used in PR dynamic imaging. This filter is slid forward to reconstruct each dynamic frame with minimal undersampling artifact. TRIPPS has been shown to provide 3D volummetric imaging of the contrast dynamics in pulmonary and renal vasculature with a high temporal resolution of 0.5 frame-per-second.

In some implementations, TRIPPS is flexible and efficient in updating the k-space center, allowing higher temporal resolution. In some implementations, TRIPPS is much more robust than some other techniques such as PR-TRICKS, Spiral-TRICKS or VIPR which is based on PR or spiral trajectories, since TRIPPS is based on a Cartesian type acquisition. The sliding window view sharing reconstruction algorithm reduces artifacts while preserving the contrast dynamics.

Figure 2A:
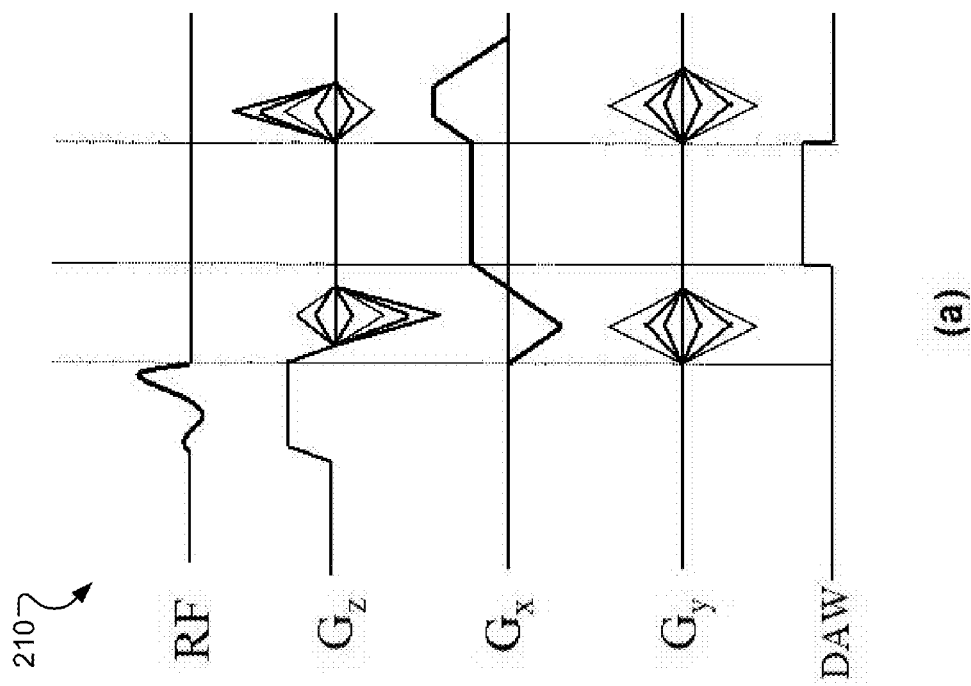
FIGS. 2a-b show an example TRIPPS pulse sequence: (2a) data acquisition scheme, (2b) k-space partitioned into half projections in the ky-kz plane and interleaved into multiple groups.
Figure 2B:
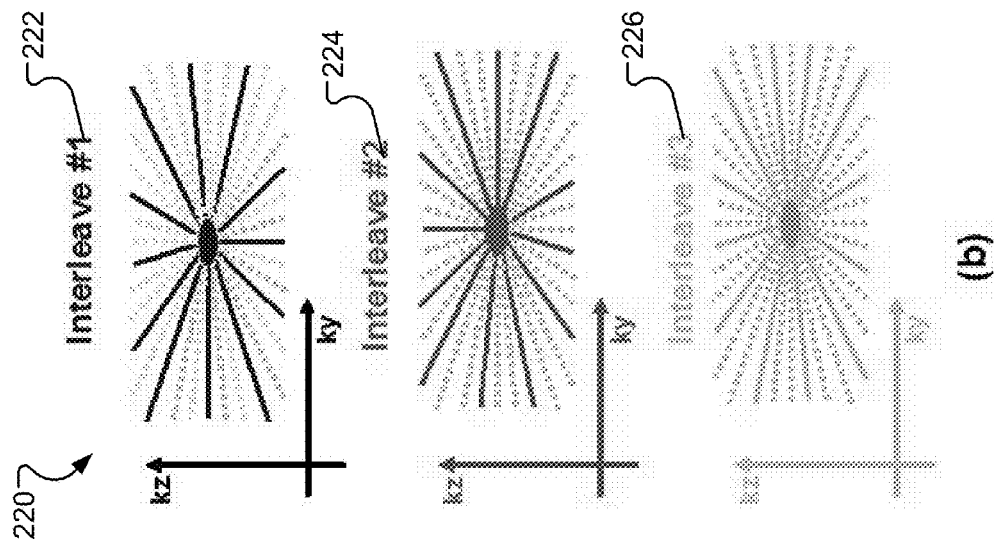

FIG. 2a shows an example pulse sequence 210 for TRIPPS, and FIG. 2b shows example data acquisition schemes 220. An asymmetric SINC pulse together with a slab selection gradient is used for 3D volumetric excitation, followed by phase encoding gradient (Gy), slice encoding gradient (Gz) and frequency encoding gradient (Gx) for spatial localization. The TRIPPS sequence can be implemented on a scanner as described in FIG. 1, such as the 3T Signa TwinSpeed scanner (from GE Healthcare Technologies, Milwaukee, Wis.) with a maximum gradient performance of 40 mT/m and 150 mT/m/ms. A short asymmetric SINC pulse is employed for slab excitation with reduced TE. A small central elliptical region can be fully sampled, providing accurate representation of the central k-space and enabling formation of a phase map used for the homodyne reconstruction. The whole k-space is partitioned into center-out half projections. Each sampling point along the half projection is actually from the nearest neighbor Cartesian grid, obviating re-gridding in the reconstruction. Therefore, a zig-zag type trajectory is more accurate in describing the sampling pattern. For simplicity, this can be identified as center-out radial trajectory. The half projections are interleaved into 12 to 24 groups of projections, with each group a small number of half projections which sparsely but uniformly cover k-space. FIG. 2b shows three interleave examples (222, 224 and 226) on the kz-ky plane. An odd number of half projections (e.g., 29) is used to create an asymmetric radial sampling of the ky-kz space. This asymmetric sampling approach can also be used in CT, such as in bent-PR sampling and EC-PR sampling for improved streak artifact reduction. Asymmetric sampling also allows for a small central elliptical region to be fully sampled for improved artifact control, providing accurate representation of the central k-space and enabling formation of a phase map used for the homodyne reconstruction. Each time, acquisition can be limited to sampling these phase and slice encodings located within the predefined interleaved radial trajectories (see FIG. 2b) to significantly speeding up the acquisition.

Image Reconstruction

Various image reconstruction algorithms can be implemented, including: 1) view sharing sliding window reconstruction; 2) iterative least square parallel image reconstruction; and 3) highly constrained backprojection reconstruction (HYPR).

Figures 3A, 3B:
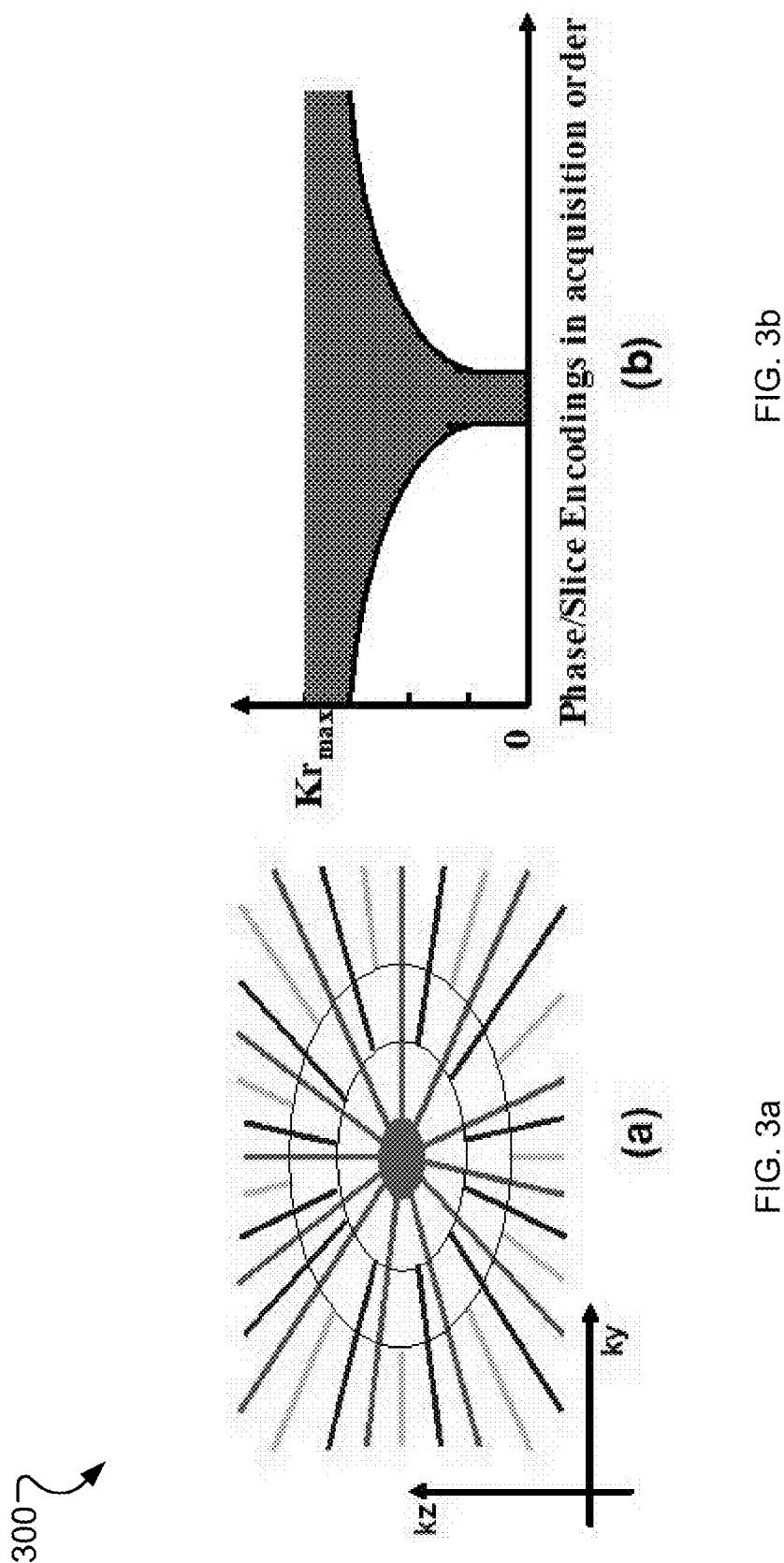
FIGS. 3a-b show an example TRIPPS image reconstruction scheme: (3a) High frequency phase and slice encoding data from neighboring interleaves shared to reduce undersampling artifact; (3b) a sliding window reconstruction algorithm used to generate dynamic images with high temporal resolution.

FIGS. 3a and 3b show an example view sharing sliding window reconstruction scheme 300. FIG. 2a shows a TRIPPS image reconstruction scheme wherein high frequency phase and slice encoding data from neighbor interleaves are shared to reduce undersampling artifact. FIG. 3b shows a sliding window reconstruction algorithm to generate high temporal resolution images. A standard 3D fast Fourier transformation reconstruction can be performed directly on the raw data because the sampling is done on a rectilinear grid in the ky-kz plane. However, direct Fourier transformation on the 3D sparsely sampled data may result in strong undersampling artifact and a significant loss of spatial resolution. Because the sparse bright vessel signal in 3D MRA is mainly determined by center k-space, view sharing of high frequency phase and slice encoding data has limited alteration to the contrast dynamics, but a significant reduction of the high frequency undersampling artifact. The view sharing strategy used in time-resolved reconstruction can operate as a filter, where the central k-space data is taken from the current dynamic frame to preserve contrast dynamics, while the outer k-space data are shared with neighboring interleaves. Data from a wider time window is shared for higher spatial frequency in the ky-kz plane, where undersampling factor is also higher.

Even with the view sharing reconstruction strategy shown in FIGS. 3a and 3b, some phase and slice encoding data may still be missing. To compensate for this, two reconstruction strategies can be implemented. For example, zero-filling can be used for the missing data, with proper density weighting to account for the data undersampling. The weighing factor is inversely proportional to the sampling density in the ky-kz plane. The density compensated view shared TRIPPS dynamic data is zero-padded and subject to 3D Fourier transformation to generate the dynamic images. Also, homodyne reconstruction can be applied to account for the asymmetric undersampling.

Figure 4:
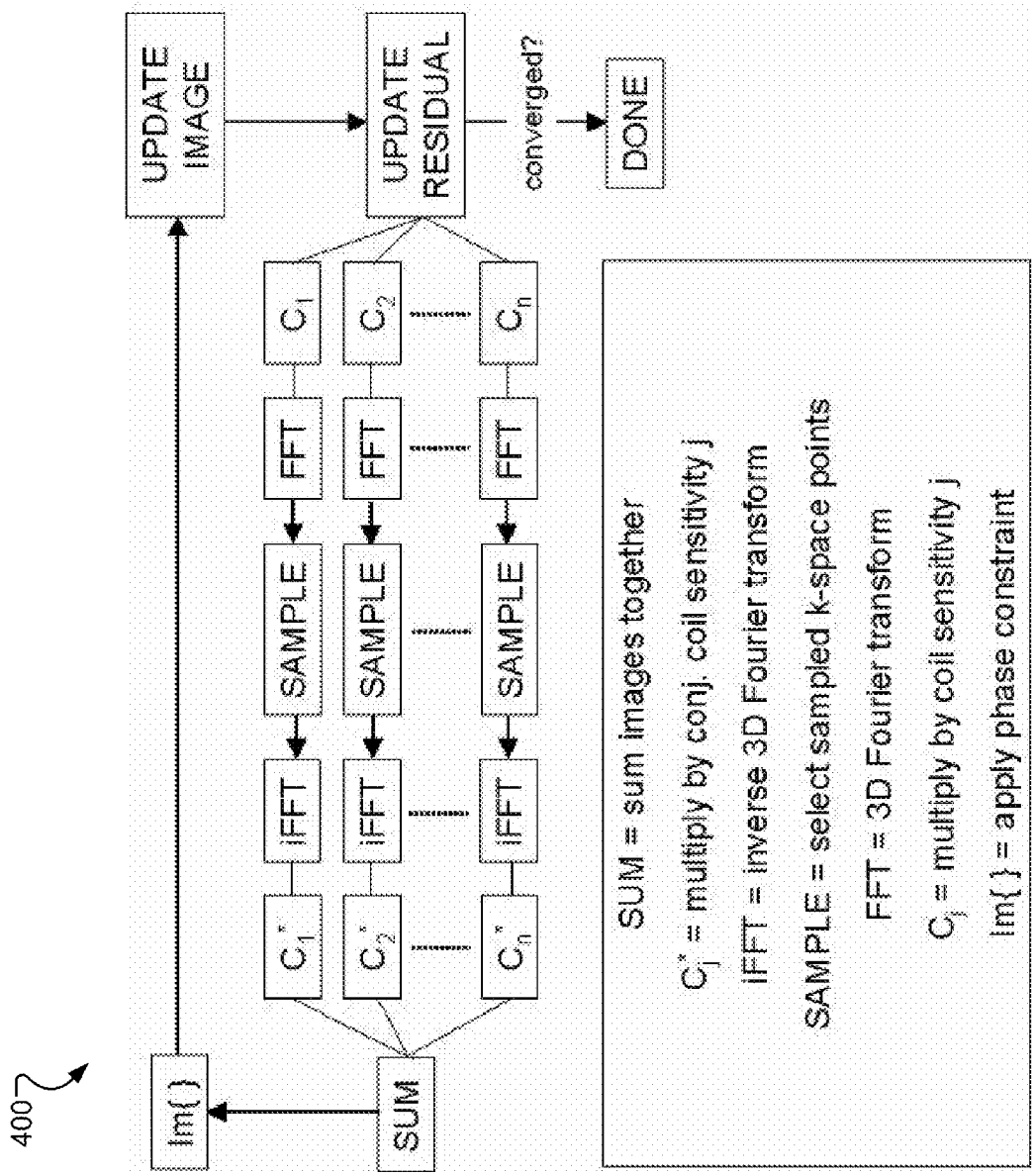
FIG. 4 shows an example reconstruction scheme for iterative least square conjugate gradient parallel image reconstruction algorithm.

FIG. 4 shows an example iterative least square parallel image reconstruction strategy 400. Partial data acquisitions such as partial Fourier and fractional echo can be used decrease acquisition times. Partial Fourier and fractional echo can impose a constraint on the final image with no phase component and so the acquired data need only support the recovery of the magnitude part of the image. This permits a reduction in the scan time or echo time.

A complementary form of partial acquisition is parallel imaging, which partially replaces the spatial encoding imparted by magnetic field gradients with the localized receive fields of a phased array coil. Combining the two approaches allows for a multiplicative speed-up in scan time although the image reconstruction must now handle both types of data undersampling.

In the case of TRIPPS sampling, maximum generality is needed and this motivates a global problem statement followed by a formal least squares error minimization using standard mathematical techniques. The basis of the approach is as follows: all that is known about the object is the acquired data under certain applied spatial encodings. The general problem statement is formulated as: what object can produce this data under the applied gradient and coil sensitivity encodings? Within this general framework every acquired data point is expressed as the summation over all pixels of the object $\rho$ subjected to a phase roll imparted by the gradient and a coil sensitivity imparted by surface coil j.

$$s_j(k)=\rho C_j(x)\exp(ik\cdot x)\rho(x) \quad [2]$$

The solution sought is that object $\rho$ which minimizes the norm of the residual error $$r(k)=s_j(k)-\Sigma C_j(x)\exp(ik\cdot x)\rho(x) \quad [3]$$

Incorporating partial Fourier adds an a priori assumption that penalizes the imaginary part:

$$Im(\rho)=0 \quad [4]$$

This type of penalized error minimization can be performed using an iterative algorithm such as conjugate gradient descent, as shown in FIG. 4. In this technique, image from each coil element is subtracted from the sum image. The residual image for each coil is multiplied by each coil sensitivity, then subject to FFT and re-sampling with TRIPPS acquisition scheme, then subject to inverse FFT, multiplied by the conjugate coil sensitivity of each coil and finally summed together. Phase constraint is applied to the summed image to form an update image, which undergoes the complex conjugate process until the residual image is converged. This reconstruction scheme is applied to TRIPPS dynamic data to suppress undersampling artifact.

Another image reconstruction algorithm can be implemented is (HYPR). In many MR applications, it is desirable to achieve high spatial and temporal resolution at the same time, such as contrast enhanced MR angiography (CE-MRA). However, fully-sampled Cartesian acquisition for big matrix size is extremely time consuming and precludes the simultaneous achievement of both goals. Several Cartesian undersampling methods, such as CAPR and TRIPPS, combined with view-sharing, parallel imaging or other reconstruction techniques can be implemented to address this problem. HYPR and HYPR with Local Reconstruction (HYPR LR) can achieve high spatial and temporal resolution without compromising image SNR using radial acquisition.

Highly constrained backprojection reconstruction can reduce the undersampling artifacts from projection acquisition while preserving good signal-to-noise ratio (SNR) at high levels of acceleration. A composite image is generated through the combination of a series of dynamic data, forming a more fully sampled image with reduced temporal characteristics. Then a temporal weighting image is produced by using the data from each time frame to restore the temporal characteristics. The weighting images are produced by backprojecting the normalized data acquired for each time frame. Because data spanning only a single time frame are used to produce the weighting image, the temporal characteristics of the weighting image are well maintained. Finally the weighting image, which contains good temporal characteristics but poor spatial resolution, is multiplied by the composite image, which contains good SNR, high spatial resolution, few artifacts but poor temporal characteristics, to produce the final HYPR image. The resulting HYPR time frames can provide both good spatial resolution and good temporal characteristics.

A Cartesian version of HYPR LR is applicable with most Cartesian undersampling methods and those with easy implementations. HYPR reconstruction can be applied to time-resolved imaging using projection reconstruction acquisitions, which are sensitive to gradient errors and off-resonance effects. TRIPPS acquisition employs radial or zig-zag trajectories in the ky-kz plane, therefore allowing HYPR reconstruction to reduce undersampling artifacts.

Figure 5:
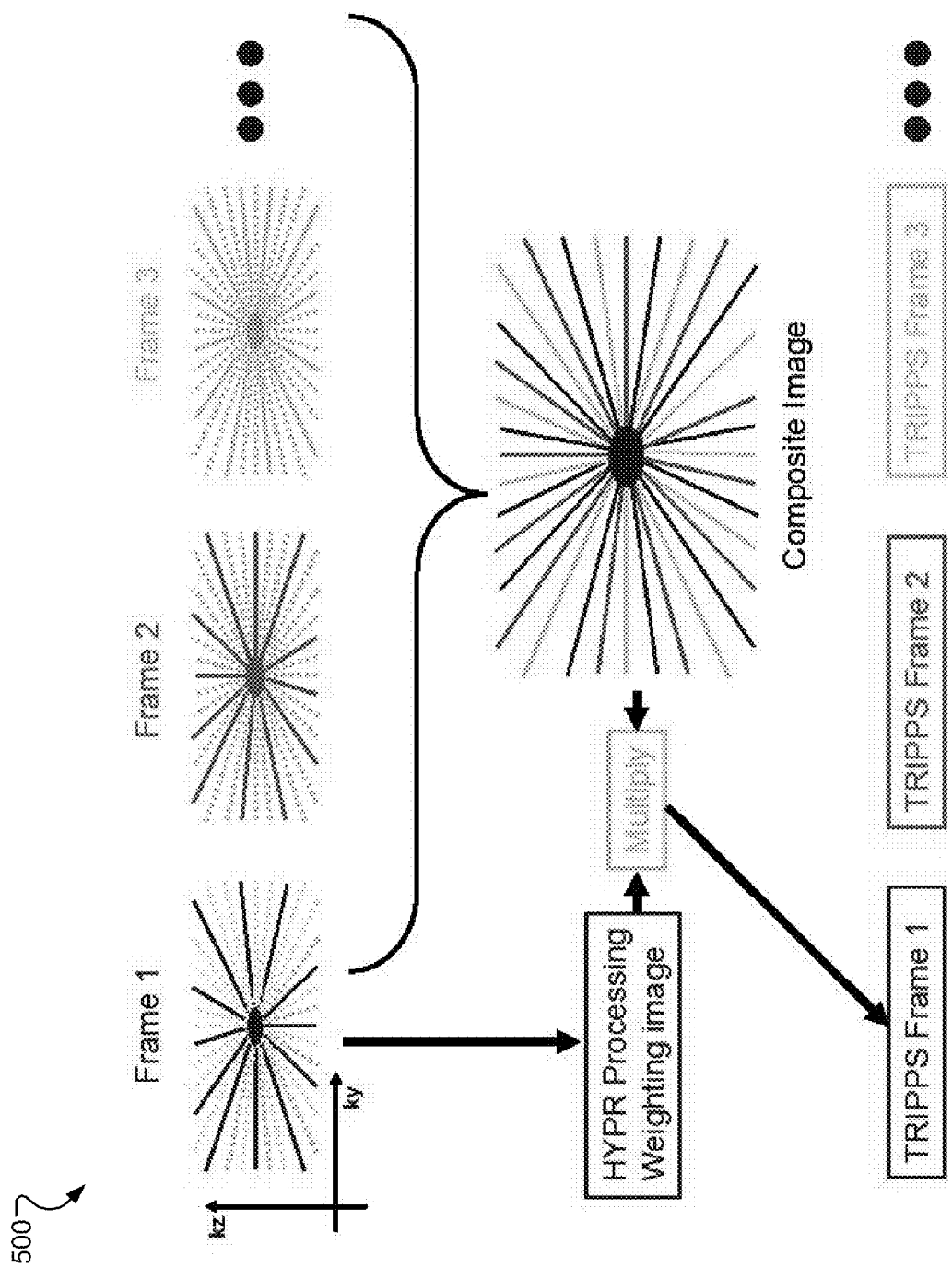
FIG. 5 shows an example highly constrained backprojection reconstruction (HYPR) processing of TRIPPS dynamic data.

FIG. 5 shows an example HYPR reconstruction scheme 500. A composite image can be generated through the combination of multiple TRIPPS time frames to reduce undersampling artifacts. A weighting image can be generated through backprojection of the TRIPPS dynamic data, which is multiplied with the composite image to generate dynamic images with reduced undersampling artifact and well preserved temporal resolution.

Figure 6:
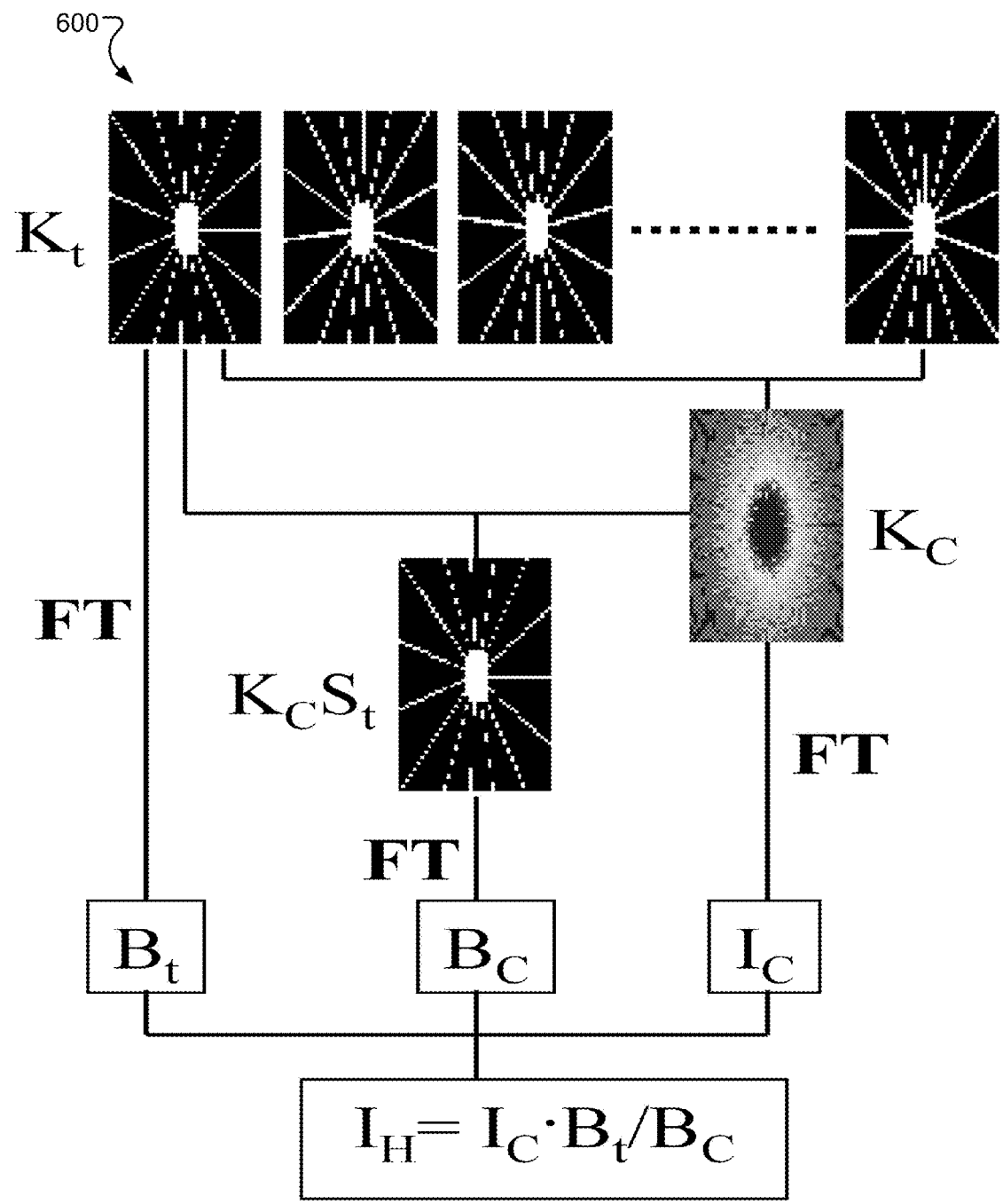
FIG. 6 shows an example diagram of Cartesian HYPR with Local Reconstruction (LR).
Figure 7:
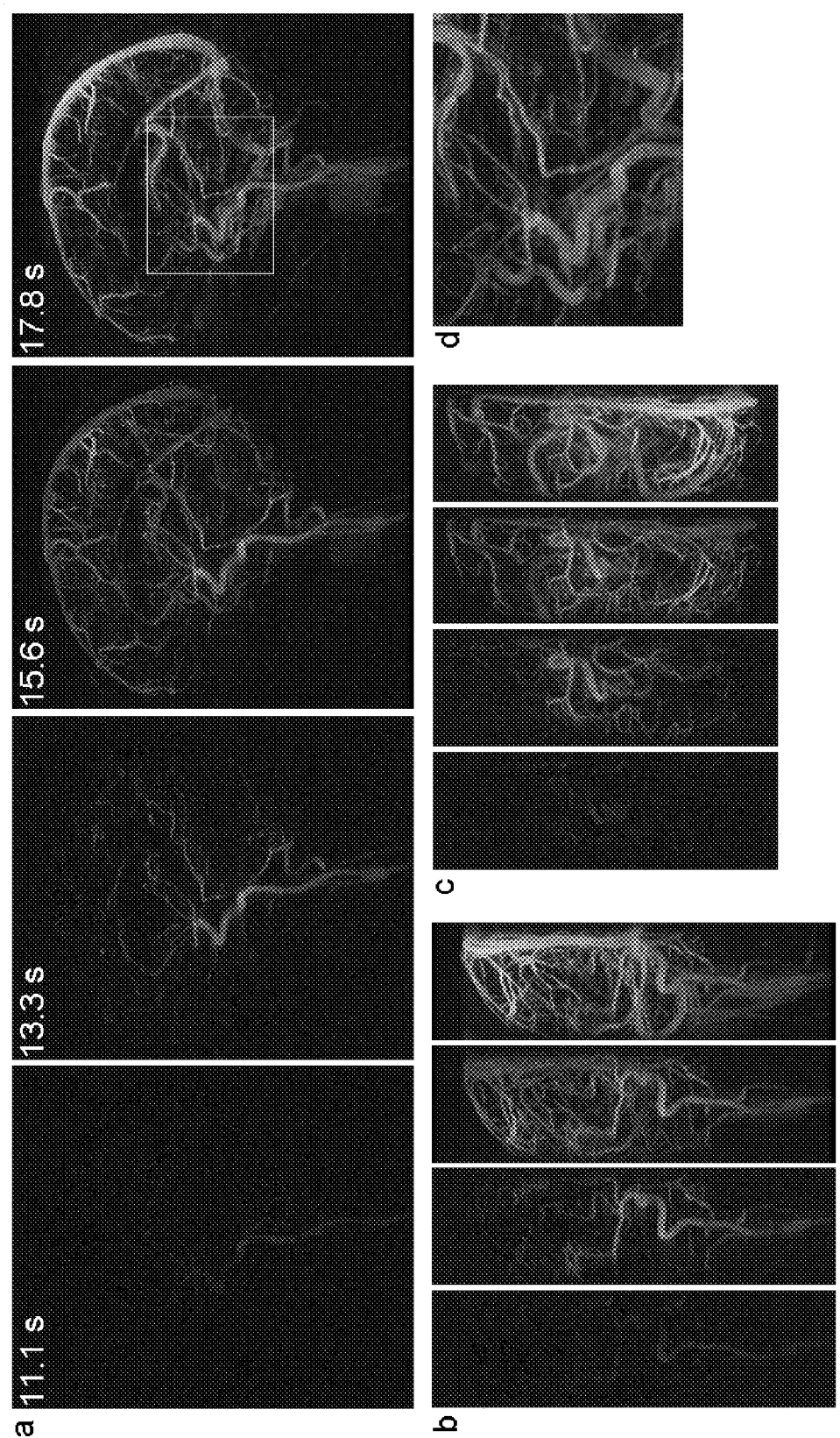
FIGS. 7a-d show example results from 3D time resolved CE MRA volunteer study.

FIG. 6 shows an example of a Cartesian HYPR LR reconstruction scheme 600. In either CAPR or TRIPPS approach, the center of ky-kz plane is fully sampled and outer region is undersampled for each time frame. The Cartesian HYPR LR method first generates a composite image by summing the k-space of all or a subset of the time frames followed by a 3D fast Fourier transform (FFT). The Cartesian HYPR LR method includes synthesizing a weighting image by calculating the ratio of a low-pass filtered time frame ($B_t$) to a low-pass filtered and also re-sampled composite image ($B_C$). Mathematically, the final HYPR image can be expressed in the same way as HYPR LR with radial sampling, i.e. $I_H=I_C\cdot I_W=I_C\cdot$ $$\frac{B_t}{B_C}$$

where $I_C$ is the composite image reconstructed by 3D Fourier transforming the composite k-space $K_C$, i.e. $I_C=FT^{-1}(K_C)$. Usually, $K_C$ is fully or nearly fully sampled so weighting is not needed. Because Cartesian undersampling sequences usually fully sample central k-space and undersample outer k-space, simple zero-filling with 3D FFT can automatically generate a favored low-pass filtered image, $B_t$, i.e. $B_t=FT^{-1}(K_t)$, where $K_t$ is the undersampled k-space of an individual time frame. Similar to the original HYPR algorithm, $B_C$ can be made by resampling $K_C$ at the same Cartesian points as $K_t$ followed by zero-filling 3D FFT, i.e $B_C=FT^{-1}(K_C\cdot S_t)$, where St is a binary matrix representing the sampling pattern of $K_t$. In all, the final HYPR image, in the case of Cartesian scheme, can be significantly simplified as $$I_H = FT^{-1}(K_C) \cdot \frac{FT^{-1}(K_t)}{FT^{-1}(K_C \cdot S_t)} \quad (1)$$

While Eq. 1 above represents the simplest case of the proposed Cartesian HYPR LR, the equation can be easily extended in the following two ways. First, a user-defined weighting matrix W can be introduced to further achieve customized low-pass filtering properties, such as including only the center fully sampled region to form the image $B_t$ and $B_C$. Second, if composite image is still significantly undersampled, Kc should be weighted prior to 3D FFT. In all, a more general expression can be written as $$I_H = FT^{-1}(K_C \cdot W_C) \cdot \frac{FT^{-1}(K_t \cdot W)}{FT^{-1}(K_C \cdot S_t \cdot W)}. \quad (2)$$

FIGS. 7a-d show example results from a CE-MRA volunteer study. The Cartesian HYPR LR method is applied to 3D time resolved CE MRA volunteer head study. Imaging parameters includes FOVx=22 cm, FOVy=18.7 cm, 64 slices with 1.0 mm slice thickness. In readout direction, 292 out of 384 points are actually sampled using fractional echo. BW=125 kHz, TE/TR=1.4/3.8 ms. Resolution shown is 0.57 mm×0.57 mm×1.0 mm with 36 time frames acquired in 80 seconds. Each time frame is undersampled by a factor of 36. After reconstruction, slice selection direction is interpolated to the same resolution as the in-plane for display.

All the saggital, coronal and axial views show excellent SNR with high resolution in all three dimensions. Even though the high undersampling factor, no apparent artifacts are present in the Cartesian HYPR LR reconstructed images.

For 3D time-resolved Cartesian undersampling sequences, the Cartesian HYPR LR method as described in this specification can achieve high spatial and temporal resolution whiling keeping high SNR. Compared with the radial acquisition based HYPR LR, the Cartesian HYPR LR is much easier to implement because all the filtering procedures are automatically implemented in k-space and FFT is computationally much more efficient than FBP or gridding algorithms.

Phantom Studies

A static phantom is scanned in the axial plane with both conventional k-space and TRIPPS sampling using a readout of 256 and 256×78 phase encodes along ky-kz, respectively. With TRIPPS acquisition, the Cartesian k-space is partitioned into 27 interleaves, with each interleave containing 29 half projections to sparsely but uniformly cover k-space. To investigate the undersampling artifact, TRIPPS images reconstructed with the temporal filter shown in FIG. 3b are compared with outer k-space window sizes of 4, 8, 12, and 24 interleaves, using a fully sampled Cartesian image as a reference. The artifact power (AP) which is a measure of the absolute difference between the "true" distribution of the image intensity and the intensity distribution on a reconstructed image, is used to evaluate the residual artifact. The reference images $I^{ref}(j)$, where j refers to a pixel, are taken to be a measure of the "true" image intensity. AP can be determined from the following equation:

$$AP = \frac{\sum_j \||I^{ref}(j)| - |I^{reconstructed}(j)|\|^2}{\sum_j |I^{ref}(j)|^2}$$

To investigate the temporal blurring due to view sharing sliding window reconstruction, the passage of the contrast bolus is simulated with a gamma variate model where the simulated arterial time course is used to re-weight the interleaved k-space data. The dynamic curves for both a low spatial frequency object (a large circle) and a high spatial frequency object (a small grid) are compared with view sharing window sizes of 4, 8, 12, and 24 interleaves.

CE-MRA Studies

The volunteer studies are approved by the institutional review board, and written informed consent is obtained from each volunteer. The TRIPPS technique is applied to renal, pulmonary and intracranial CE-MRA. Typical acquisition parameters for the renal/pulmonary study includes: field of view (FOV) of 32 cm, 32 slices, 2 to 4 mm slice thickness, repetition time (TR)=3.6 ms, TE=1.1 to 1.4 ms, flip angle=30°, bandwidth=±125 kHz, readout=256, scan time=24 to 32 seconds, 12 to 16 interleaves, coronal scan with an eight-channel body phased array coil for signal reception. For the intracranial study, the FOV is reduced to 20 cm, with 56 slices and a slice thickness of 1.4 mm, 24 interleaves, sagittal scan with an eight-channel neurovascular coil for signal reception. Fifteen to 29 half projections are sampled with the central 100 views fully sampled for each interleave, yielding a temporal resolution of 2 seconds-per-frame. In total 20 to 30 ml of Gd-based contrast agent is injected into a vein of the right arm at a rate of 2 to 3 ml/sec followed by 30 ml of saline at the same rate using a power injector (from Spectris Solaris, Medrad Inc., Indianola, Pa., for example). After the TRIPPS imaging acquisition, raw data are transferred to a computing system, such as a Linux computer for off-line image reconstruction.

Figure 8:
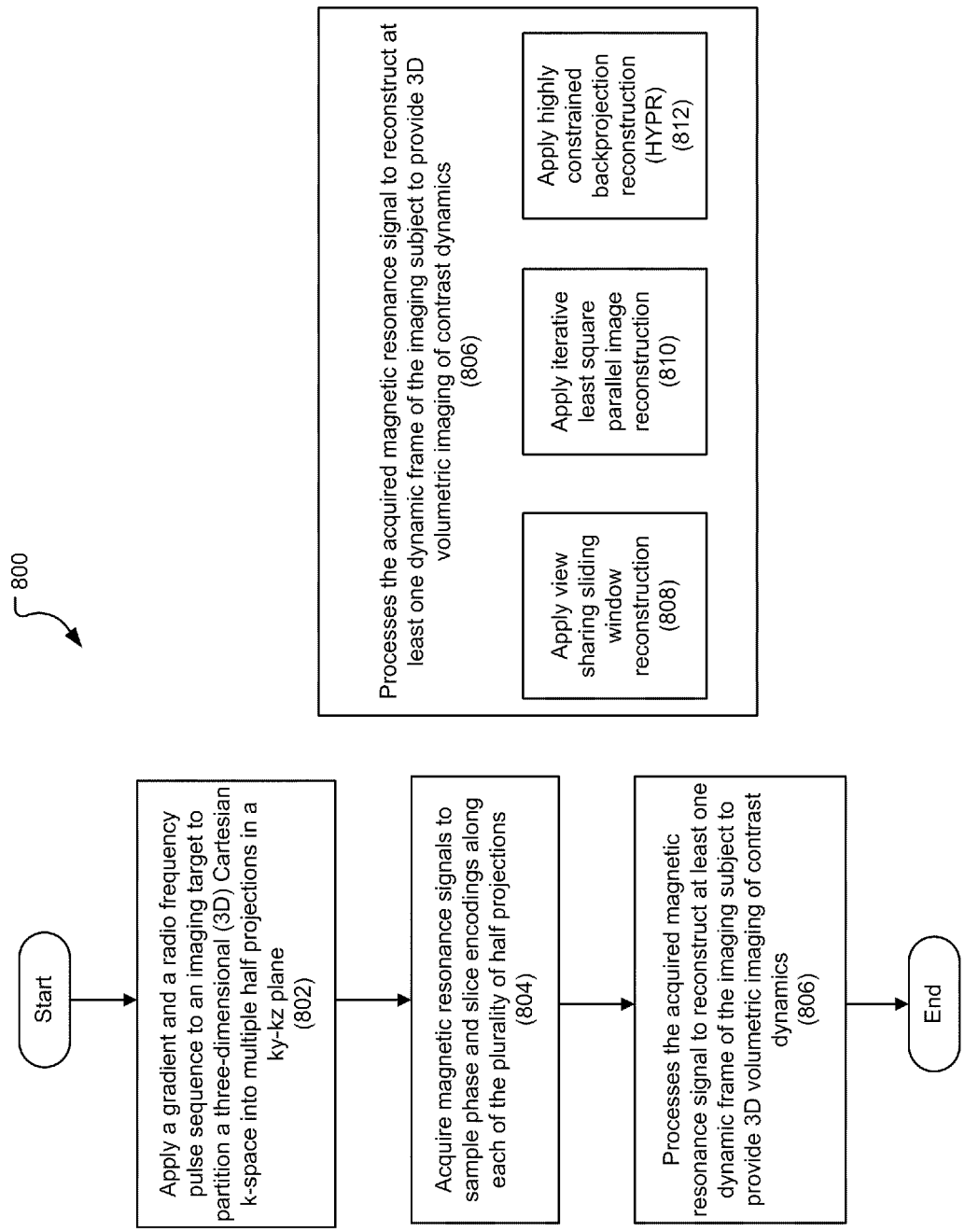
FIG. 8 shows an example processor for implementing TRIPPS acquisition.

FIG. 8 shows an example process for implementing TRIPPS acquisition. An MRI system (e.g., MRI system 100) applies a gradient and a radio frequency pulse sequence to an imaging target to partition a three-dimensional (3D) Cartesian k-space into multiple half projections in a ky-kz plane (802). The half projections are divided into multiple interleaves with each interleave including one or more of the half projections and providing an asymmetric radial sampling of the ky-kz plane. The MRI system acquires magnetic resonance signals to sample phase and slice encodings along each of the plurality of half projections (804). The MRI system processes the acquired magnetic resonance signal to reconstruct at least one dynamic frame of the imaging subject to provide 3D volumetric imaging of contrast dynamics (806). Processing the acquired magnetic resonance signal can be performed using the image reconstruction techniques described above including: view sharing sliding window reconstruction (808); iterative least square parallel image reconstruction (810); and highly constrained backprojection reconstruction (HYPR) (812).

Results

Figure 9:
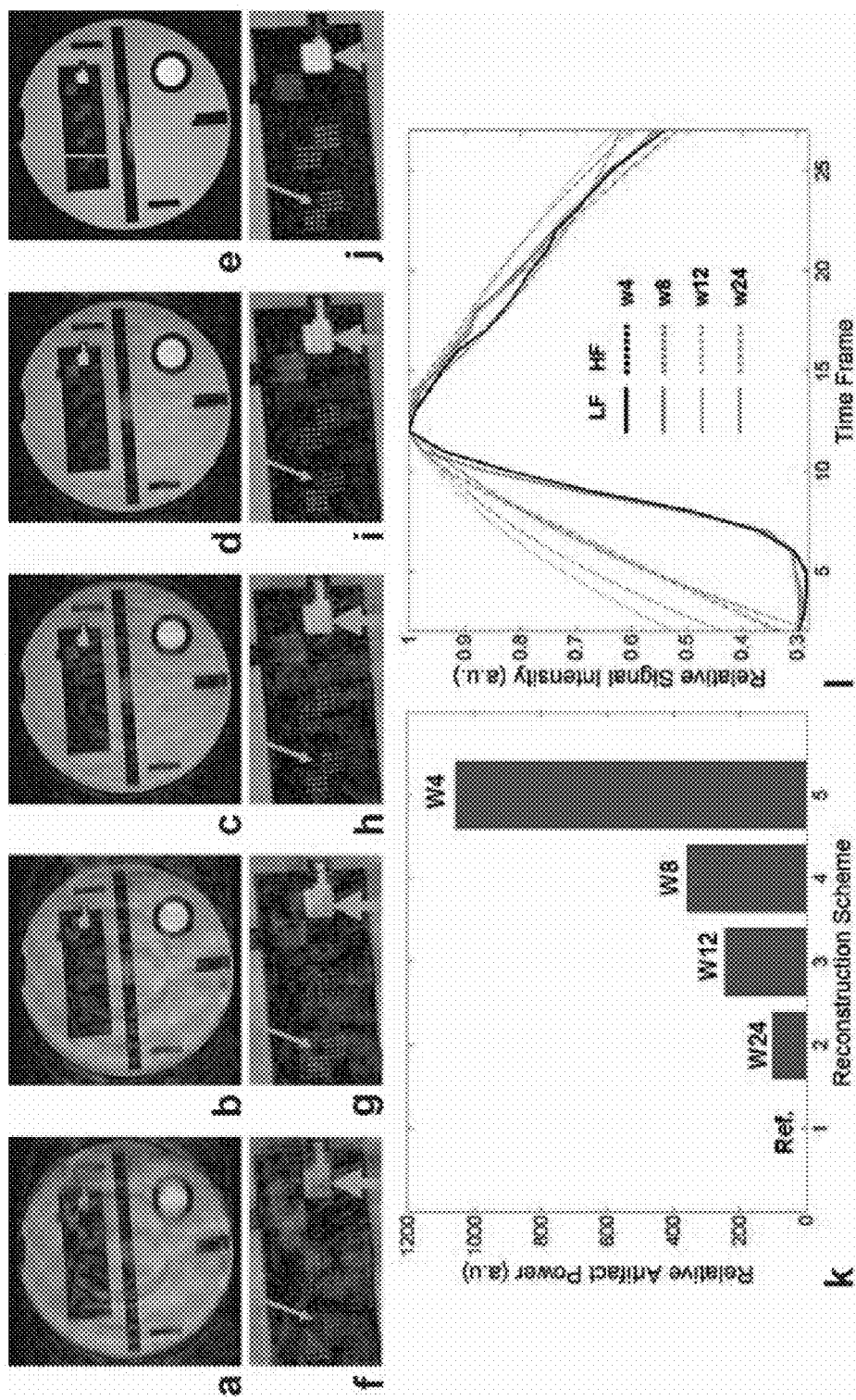
FIGS. 9a-l show example results of phantom study using TRIPPS acquisition with a view sharing sliding window reconstruction algorithm with a series of outer k-space window size of 4, 8, 12 and 24 interleaves.

FIGS. 9a-l shows results of an example phantom study using TRIPPS acquisition with a view sharing sliding window reconstruction algorithm with a series of outer k-space window size of 4, 8, 12 and 24 interleaves (FIGS. 9a-d) and conventional Cartesian sampling (FIG. 9e). A small region is zoomed to show the artifacts associated with undersampling (FIGS. 9f-i) and full sampling (FIG. 9j). FIG. 9k shows the artifact power associated with different outer k-space window sizes. The artifact power is reduced significantly when the window size is increased from 4 to 24. FIG. 9I shows the temporal blurring due to high frequency view sharing from neighboring interleaves. The contrast dynamic curves are very similar for low spatial frequency data, but there is significant broadening for high spatial frequency data when the outer k-space window size is increased from 4 to 24.

Figure 10:
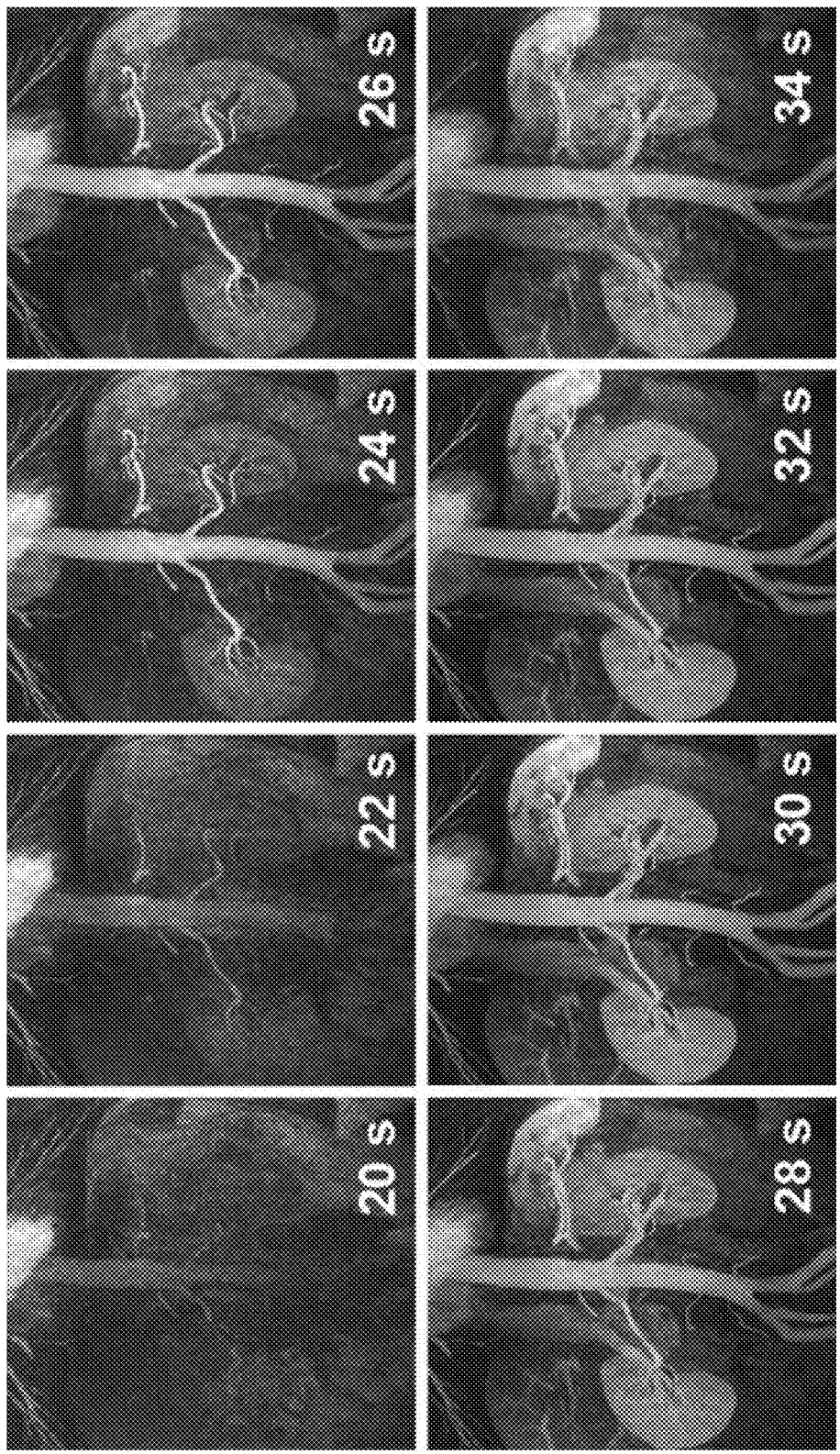
FIG. 10 shows an example of TRIPPS imaging of the renal vasculature of a 63 year old male volunteer.

TRIPPS is first applied to the renal vasculature where a high temporal resolution is desirable to depict the fast arterial venous transition of the contrast material. FIG. 10 shows example results of selected coronal maximum intensity projections (MIPs) of TRIPPS imaging of a kidney of a 63-year old male volunteer. The imaging FOV of 32 cm, readout of 256 and 2 mm slice thickness results in an acquired voxel size of $1.25 \times 1.25 \times 2.0$ mm$^3$, which is zero-padded to a reconstruction voxel size of $0.625 \times 0.625 \times 0.625$ mm$^3$. The high temporal resolution of 2 second-per-frame provides excellent depiction of the contrast filling of the aorta, renal artery, parenchyma, renal veins and portal veins. The renal venous system enhances about 5 seconds after the arterial system.

Figure 11:
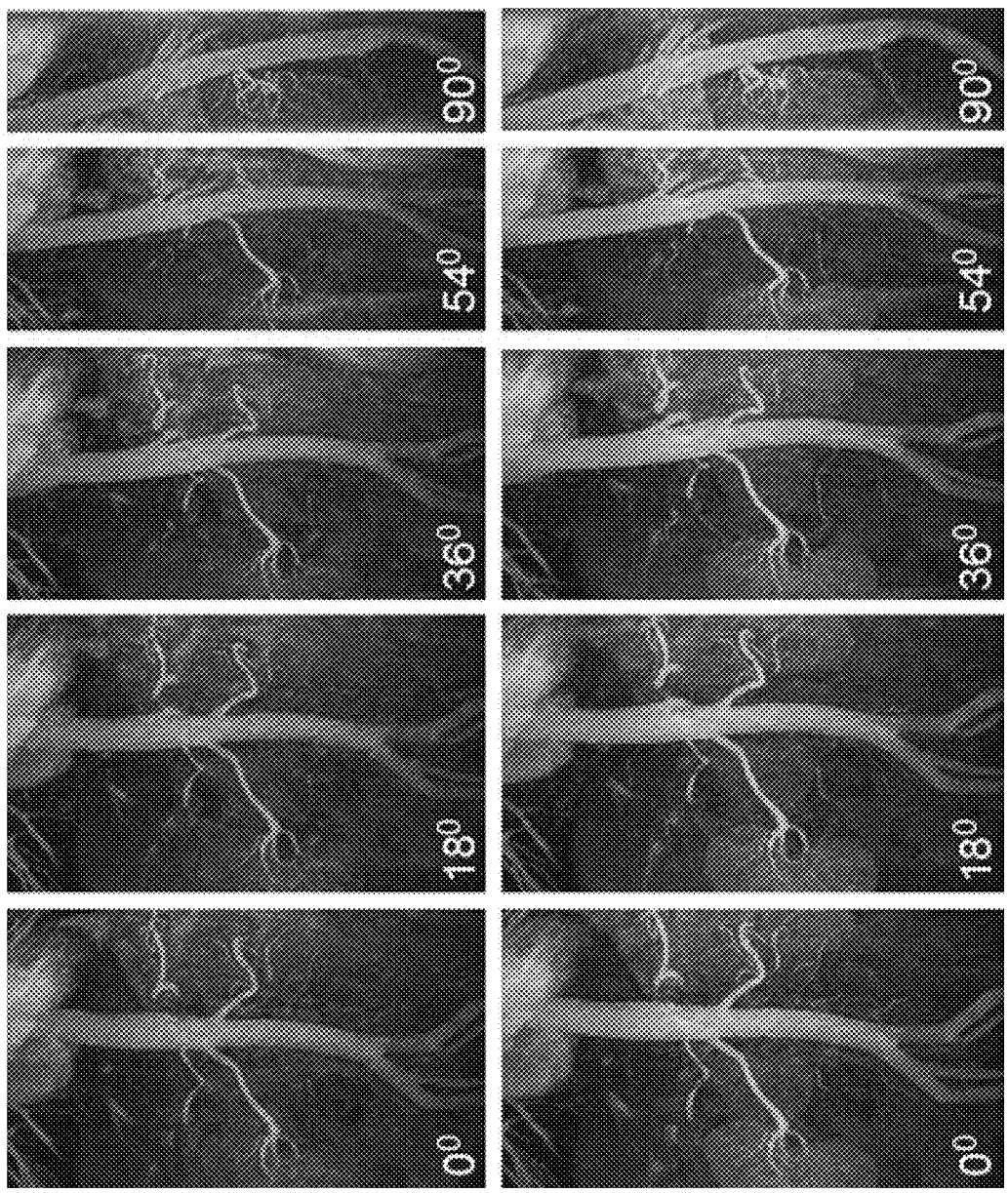
FIG. 11 shows example 3D re-projection MIPs of two consecutive time frames from TRIPPS imaging of a renal vasculature.

FIG. 11 shows example rotation MIP images of two consecutive peak renal arterial phases. The rotation MIP images demonstrate both high spatial resolution and high temporal resolution.

Figure 12:
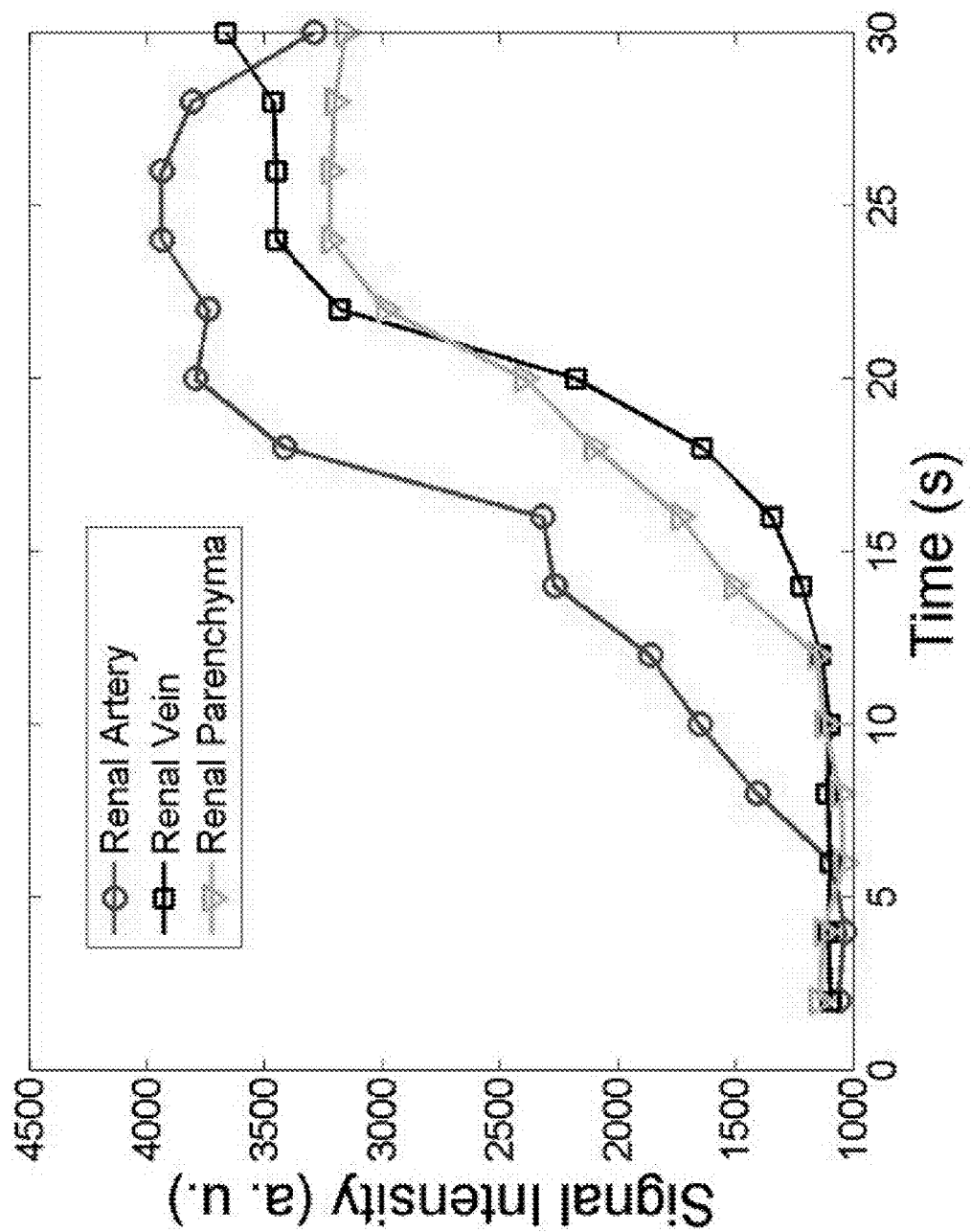
FIG. 12 is a plot illustrating example contrast enhancement curves for a pulmonary artery, pulmonary vein and aorta.

FIG. 12 shows the contrast enhancement curves for the renal artery, renal vein and renal parenchyma, respectively. The data shown in FIG. 12 represents mean signal intensity obtained form regions of interests (ROIs) drawn in renal artery, renal vein and renal parenchyma. The renal venous system enhances about 5 seconds after the arterial system, making it challenging to generate an arteral phase image using conventional single volume acquisition.

Figure 13:
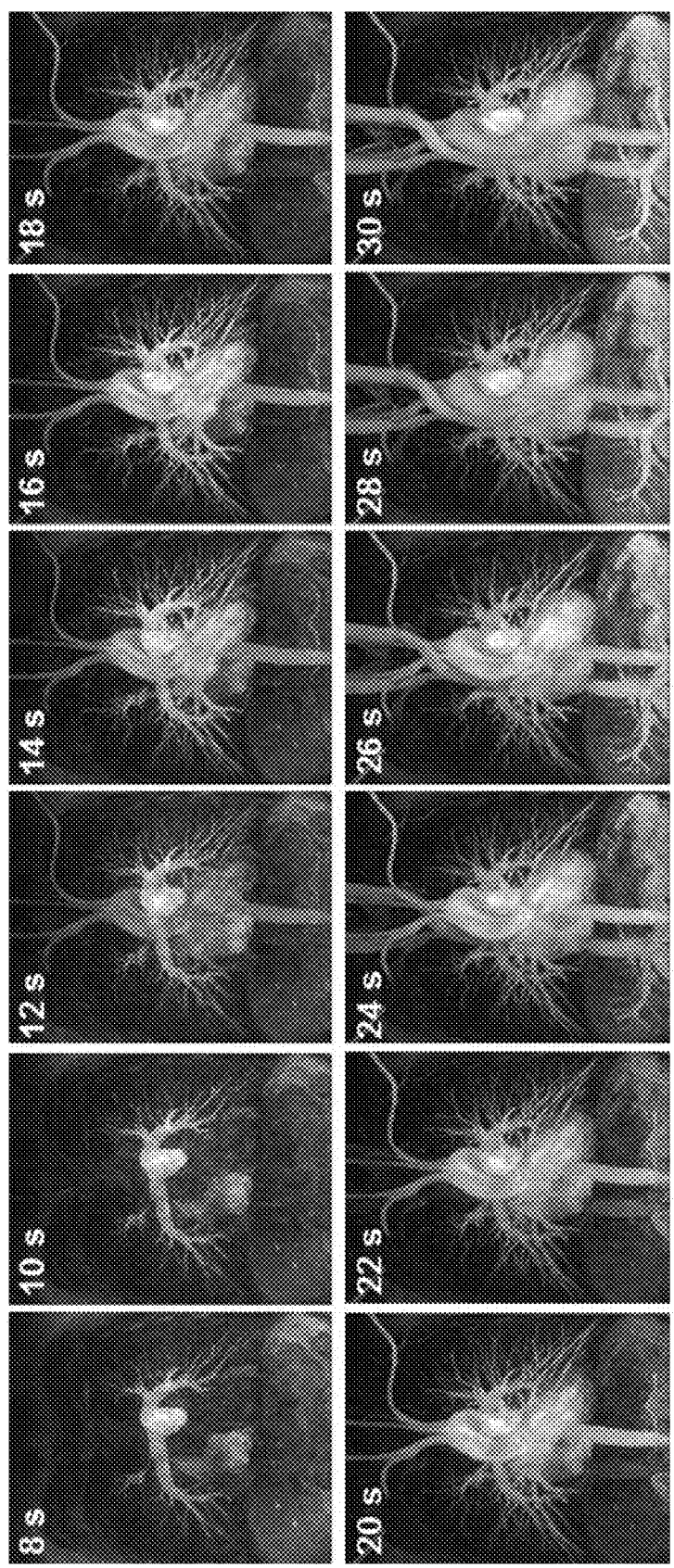
FIG. 13 shows example TRIPPS imaging of the pulmonary vasculature of a 35 year old volunteer.

FIG. 13 shows selected coronal MIPs of TRIPPS imaging of the pulmonary of a 35-year old male volunteer. The imaging FOV of 32 cm, readout of 256 and 4 mm slice thickness result in an acquired spatial resolution of $1.25 \times 1.25 \times 4.0$ mm$^3$, which is zero-padded to a reconstruction voxel size of $0.625 \times 0.625 \times 1.0$ mm$^3$. The flip angle=30°, bandwidth=±125 kHz, and scan time=30 seconds. 30 ml of Gd-based contrast agent is injected at a rate of 3 ml/sec followed by 30 ml of saline at the same rate. After data acquisition, the raw data (P files) is transferred to a desktop for off-line image reconstruction. The high temporal resolution of 2 second-per-frame provides excellent depiction of the contrast dynamics in pulmonary arterial and venous segmental and subsegmental branches. The pulmonary venous system enhances shortly after the arterial system, making it challenging to generate an arterial phase image using conventional single volume acquisition.

Figure 14:
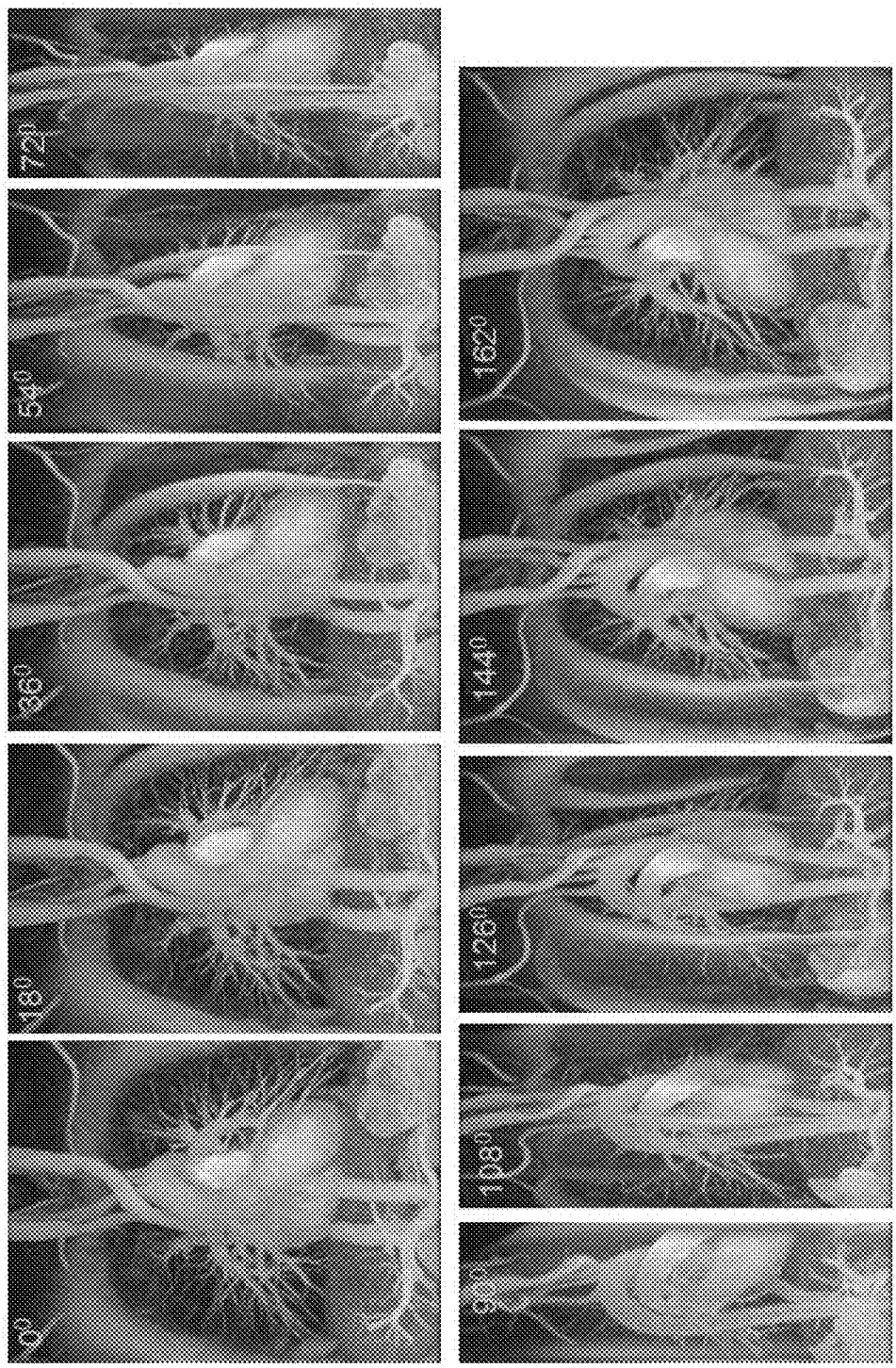
FIG. 14 shows an example selected 3D MIP of a late time frame of a pulmonary vasculature at a series of rotation angles.

FIG. 14 shows rotation of a MIP of a late time frame, demonstrating the high spatial resolution. The high fat and muscle signals from abdomen can be suppressed through mask subtraction. Another way to remove the fat and muscle signals is to use limited maximal intensity projection (MIP), or manually segment the outer 3D volume in a workstation followed by MIP at different rotation angles. The example shown in FIG. 14 includes selected 3D MIP of a late time frame of the pulmonary vasculature at a series of rotation angles: 0°, 18°, 36°, 54°, 72°, 90°, 108°, 144° and 162°.

Figure 15:
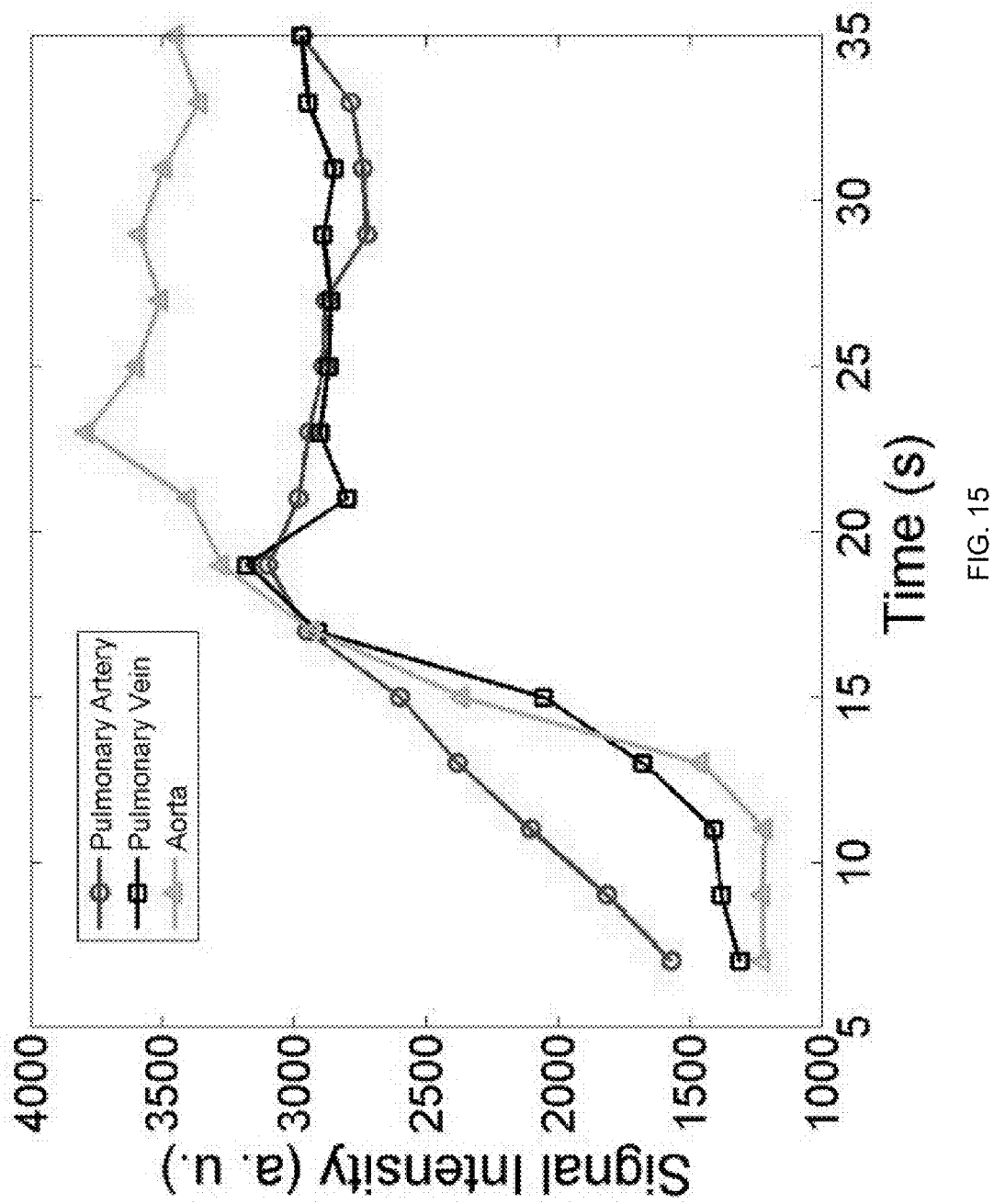
FIG. 15 is a plot illustrating example contrast enhancement curves for a renal artery, renal vein and renal parenchyma.

FIG. 15 shows example contrast enhancement curves for the pulmonary artery, pulmonary vein and aorta, respectively. The data shown in FIG. 15 represents mean signal intensity form ROIs drawn in the pulmonary artery, pulmonary vein and aorta. The pulmonary venous system enhances shortly after the arterial system, which can, in some cases, present a challenge to generate an arteral phase image using conventional single volume acquisition.

Figure 16:
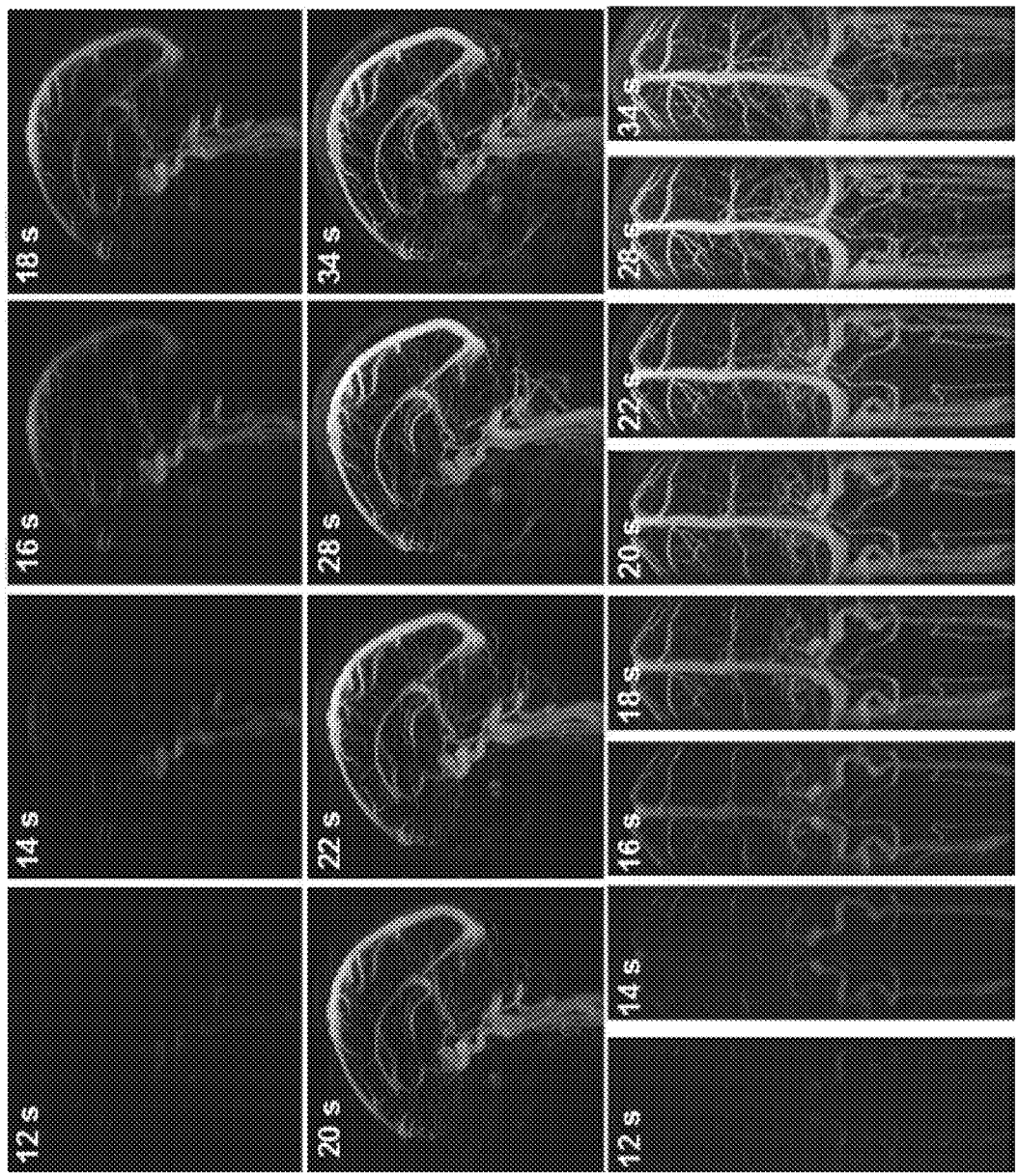
FIG. 16 shows example coronal MIP of the time resolved images from TRIPPS imaging of a brain and sagittal MIP of dynamic images of the same scan, demonstrating high temporal resolution and broad slice coverage.

FIG. 16 shows selected sagittal MIPs of TRIPPS imaging of the brain with a FOV of 22 cm, readout of 256 and 1.4 mm slice thickness, resulting in an acquired voxel size of $0.85 \times 0.85 \times 1.4$ mm3. A temporal resolution of 2 second-per-frame provides excellent depiction of the contrast filling of the intracranial arteries and veins. However, higher temporal resolution, such as sub-second frame rates, may be needed for more detailed depiction of the hemodynamics of arterial-venous malformations (AVM), which are important in defining risk factors of hemorrhage. This may require further optimization of the sampling trajectories, higher undersampling factors and improved reconstruction techniques.

As described above, TRIPPS, in some implementations, is able to provide time-resolved contrast-enhanced MRA of the renal, pulmonary and intracranial vasculatures with high spatial resolution, high temporal resolution and relatively broad slice coverage simultaneously. Undersampling of the half projection data allows a speedup factor of 15 to 25 relative to conventional fully sampled Cartesian acquisition. The combination of asymmetric radial sampling, interleaved acquisition, high frequency view sharing and density compensation minimizes the undersampling artifact and spatial resolution degradation. Furthermore, TRIPPS is based on Cartesian acquisition, thus robust to eddy currents, gradient errors and off-resonance effects. TRIPPS combines the efficiency of interleaved undersampled PR acquisition and robustness of Cartesian imaging, therefore highly potential for clinical dynamic imaging.

TRIPPS allows significantly higher undersampling than EC-PR, especially for high spatial frequency phase and slice encodings. It is desirable to further undersample the high spatial frequency data in the ky-kz plane to exploit the fact that the sparse bright vessel signals in 3D CE-MRA are largely located at k-space center, and undersampling of the periphery of ky-kz space provides minimal streak artifact. Interleaving of the highly undersampled projections allows the high frequency data from neighboring interleaves to uniformly cover k-space, and thus perform more efficient view sharing reconstruction strategy in terms of artifact reduction. The window size of the temporal filter is kept small to just include the fully sampled central views, and increased quadratically to include more projection data for higher spatial frequencies. Improved streak artifact control can be achieved by increasing the fully sampled central region at the cost of reduced temporal resolution especially for small vessels where signal in the outer k-space regions become more important.

EC-PR employed full echo acquisition so that 2D homodyne reconstruction can be performed with asymmetric sampling in the ky-kz plane. However, TRIPPS employed partial echo acquisition, which effectively shortened TE from 2.3 ms down to 1.1 to 1.4 ms, reducing the degradation of image quality due to T2* decay and flow effects. Partial echo and asymmetric sampling in the ky-kz plane invalidate regular 2D homodyne reconstruction. Sparse reconstruction is employed for TRIPPS imaging, with proper density weighting which is higher for high frequency phase and slice encodings to compensate for the increased undersampling at the periphery of ky-kz space. The EC-PR study shows that the 2D homodyne reconstruction performs better for the popliteal trifurcation with high background signal, and worse for carotid studies with low background signal when compared with simple sparse reconstruction. The background signal in renal and pulmonary imaging is relatively low. Complex subtraction is performed for intracranial imaging to suppress background signal. Furthermore, partial echo combined with partial phase and partial slice encodings has been widely used in time-resolved 3D pulmonary and intracranial imaging. Therefore, the density compensated sparse reconstruction is suitable for high resolution TRIPPS imaging of the renal, pulmonary and intracranial vasculature.

Spatial undersampling in TRIPPS, TRICKS and time-resolved echo-shared acquisition technique (TREAT) involves the interpolation of k-space data from other acquired samples in the same timeframe. However, while TRICKS and TREAT provide a relatively small acceleration factor of 3 without undersampling artifact, TRIPPS is more flexible and more efficient in updating the k-space center, allowing higher acceleration factor up to 25 at the cost of moderate undersampling artifact. TRIPPS is much more robust than undersampled PR type techniques because it is basically a Cartesian type acquisition. The sliding window view sharing reconstruction algorithm provides minimal streak artifact while preserving the contrast dynamics.

Parallel imaging techniques, which partially replaces the spatial encoding imparted by magnetic field gradients with the localized receive fields of a phased array coil, such as SENSE and GRAPPA, can be combined with Cartesian or PR type acquisitions to further increase the acquisition speed. Also sampling schemes and reconstruction methods can be designed to further exploit the spatial-temporal correlation in MR images and to reduce redundant data, including RIGR, k-t BLAST and k-t SENSE. TRIPPS acquisition as described in this specification can be further combined with parallel imaging reconstruction using an iterative algorithm such as conjugate gradient descent, or GRAPPA where the fully sampled central k-space can be used as auto-calibration data.

TRIPPS is able to generate 3D dynamic images of the renal, pulmonary and intracranial vasculatures with high spatial resolution and high temporal resolution. The undersampling artifacts are effectively suppressed through interleaving and view sharing of the sparse projection data in the ky-kz plane. Further optimization of this technique, including sampling trajectories and advanced reconstruction techniques such as parallel imaging and HYPR reconstruction, may render this technique a robust and efficient tool for clinical diagnosis of vascular disease in many human organs.

Various implementations of the subject matter described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications, or code) include machine instructions for a programmable processor, and may be implemented in a high-level procedural and/or object-oriented programming language, and/or in assembly/machine language. A machine-readable medium includes any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal.

To provide for interaction with a user, the subject matter described herein may be implemented on a computer having a display device (e.g., a CRT (cathode ray tube) or LCD (liquid crystal display) monitor) for displaying information to the user and a keyboard and a pointing device (e.g., a mouse or a trackball) by which the user may provide input to the computer. Other kinds of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

The subject matter described herein may be implemented in a computing system that includes a back-end component (e.g., as a data server), or that includes a middleware component (e.g., an application server), or that includes a front-end component (e.g., a client computer having a graphical user interface or a Web browser through which a user may interact with an implementation of the subject matter described herein), or any combination of such back-end, middleware, or front-end components. The components of the system may be interconnected by any form or medium of digital data communication (e.g., a communication network). Examples of communication networks include a local area network ("LAN"), a WAN, and the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this application.

What is claimed is what is described and illustrated, including:

1. A method performed by a nuclear magnetic resonance imaging (MRI) system, comprising:
    applying, at a scanner comprising a magnet, gradient coils and a radio frequency system, a gradient and a radio frequency pulse sequence to an imaging target to partition a three-dimensional (3D) Cartesian k-space into half projections in a ky-kz plane, the half projections divided into interleaves, each interleave comprising one or more of the half projections and providing an asymmetric radial sampling of the ky-kz plane;

acquiring, at the scanner, magnetic resonance signals to sample phase and slice encodings along each of the half projections; and processing, at a data processing system in communication with the scanner, the acquired magnetic resonance signals to reconstruct at least one dynamic frame of the imaging target to provide 3D volumetric imaging of contrast dynamics.

2. The method of claim 1, wherein processing the acquired magnetic resonance signals comprises applying a 3D fast Fourier transformation reconstruction on the acquired magnetic resonance signals.

3. The method of claim 1, wherein processing the acquired magnetic resonance signals comprises applying a view sharing sliding window filter to obtain central k-space data from a current dynamic frame and sharing outer k-space data with neighboring interleaves.

4. The method of claim 3, wherein sharing the outer k-space data comprises changing a width of a time window to share data from different spatial frequencies in the ky-kz plane.

5. The method of claim 3, wherein applying the view sharing sliding window filter comprises using zero-filling to compensate for any missing data.

6. The method of claim 3, wherein applying the view sharing sliding window filter comprises applying homodyne reconstruction to compensate for asymmetric undersampling.

7. The method of claim 1, wherein processing the acquired magnetic resonance signals comprises applying iterative least square parallel image reconstruction to partially replace spatial encoding imparted by magnetic field gradients with localized receive fields of a phased array coil.

8. The method of claim 1, wherein processing the acquired magnetic resonance signals comprises applying highly constrained backprojection reconstruction comprising:

generating a composite image through a combination of a series of dynamic data comprising multiple time frames;

generating a weighting image through backprojection of the series of dynamic data;

multiplying the generated weighting image with the composite image to generate dynamic images.

9. A non-transitory machine-readable medium, storing instructions adapted to cause one or more hardware components of a magnetic resonance imaging system to perform operations comprising:

applying a gradient and a radio frequency pulse sequence to an imaging target to partition a three-dimensional (3D) Cartesian k-space into half projections in a ky-kz plane, the half projections divided into interleaves, each interleave comprising one or more of the half projections and providing an asymmetric radial sampling of the ky-kz plane;

acquiring magnetic resonance signals to sample phase and slice encodings along each of the plurality of half projections; and processing the acquired magnetic resonance signals to reconstruct at least one dynamic frame of the imaging target to provide 3D volumetric imaging of contrast dynamics.

10. The non-transitory machine readable medium of claim 9, wherein the instructions are adapted to cause one or more hardware components of a magnetic resonance imaging system to process the acquired magnetic resonance signals by performing operations comprising applying a 3D fast Fourier transformation reconstruction on the acquired magnetic resonance signals.

11. The non-transitory machine readable medium of claim 9, wherein the instructions are adapted to cause one or more hardware components of a magnetic resonance imaging system to process the acquired magnetic resonance signals by performing operations comprising applying a view sharing sliding window filter to obtain central k-space data from a current dynamic frame and sharing outer k-space data with neighboring interleaves.

12. The non-transitory machine readable medium of claim 11, wherein the instructions are adapted to cause one or more hardware components of a magnetic resonance imaging system to share the outer k-space data by performing operations comprising changing a width of a time window to share data from different spatial frequencies in the ky-kz plane.

13. The non-transitory machine readable medium of claim 11, wherein the instructions are adapted to cause one or more hardware components of a magnetic resonance imaging system to apply the view sharing sliding window filter by performing operations comprising using zero-filling to compensate for any missing data.

14. The non-transitory machine readable medium of claim 11, wherein the instructions are adapted to cause one or more hardware components of a magnetic resonance imaging system to apply the view sharing sliding window filter by performing operations comprising applying homodyne reconstruction to compensate for asymmetric undersampling.

15. The non-transitory machine readable medium of claim 9, wherein the instructions are adapted to cause one or more hardware components of a magnetic resonance imaging system to process the acquired magnetic resonance signals by performing operations comprising applying iterative least square parallel image reconstruction to partially replace spatial encoding imparted by magnetic field gradients with localized receive fields of a phased array coil.

16. The non-transitory machine readable medium of claim 9, wherein the instructions are adapted to cause one or more hardware components of a magnetic resonance imaging system to process the acquired magnetic resonance signals by performing operations comprising applying highly constrained backprojection reconstruction comprising:

generating a composite image through a combination of a series of dynamic data comprising multiple time frames;

generating a weighting image through backprojection of the series of dynamic data;

multiplying the generated weighting image with the composite image to generate dynamic images.

17. A system for magnetic resonance imaging (MRI) comprising:

a scanner comprising a magnet, gradient coils and a radio frequency system to apply a gradient and a radio frequency pulse sequence to an imaging target to partition a three-dimensional (3D) Cartesian k-space into half projections in a ky-kz plane, the half projections divided into interleaves, each interleave comprising one or more of the half projections and providing an asymmetric radial sampling of the ky-kz plane, and acquire magnetic resonance signals to sample phase and slice encodings along each of the plurality of half projections; and a data processing system in communication with the scanner to receive the acquired magnetic resonance signals and process the received magnetic resonance signals to reconstruct at least one dynamic frame of the imaging target to provide 3D volumetric imaging of contrast dynamics.

18. The MRI system of claim 17, wherein the data processing system is configured to process the received magnetic resonance signals by applying a 3D fast Fourier transformation reconstruction on the received magnetic resonance signals.

19. The MRI system of claim 17, wherein the data processing system is configured to process the received magnetic resonance signals by applying a view sharing sliding window filter to obtain central k-space data from a current dynamic frame and sharing outer k-space data with neighboring interleaves.

20. The MRI system of claim 19, wherein the data processing system is configured to share the outer k-space data by changing a width of a time window to share data from different spatial frequencies in the ky-kz plane.

21. The MRI system of claim 19, wherein the data processing system is configured to apply the view sharing sliding window filter by using zero-filling to compensate for any missing data.

22. The MRI system of claim 19, wherein the data processing system is configured to apply the view sharing sliding window filter by applying homodyne reconstruction to compensate for asymmetric undersampling.

23. The MRI system of claim 17, wherein the data processing system is configured to process the magnetic resonance signal by applying iterative least square parallel image reconstruction to partially replace spatial encoding imparted by magnetic field gradients with localized receive fields of a phased array coil.

24. The MRI system of claim 17, wherein the data processing system is configured to process the magnetic resonance signal by applying highly constrained backprojection reconstruction comprising:
 a composite image generated through a combination of a series of dynamic data comprising multiple time frames; and
 a weighting image generated through backprojection of the series of dynamic data;
 wherein the generated weighting image is multiplied with the composite image to generate dynamic images.

25. The MRI system of claim 17, wherein the gradient and the radio frequency pulse sequence comprises:
 an asymmetric SINC pulse and a slab selection gradient to perform 3D volumetric excitation; and
 a phase encoding gradient (Gy), a slice encoding gradient (Gz) and a frequency encoding gradient (Gx) to obtain spatial localization.

\* \* \* \* \*

UNITED STATES PATENT AND TRADEMARK OFFICE
CERTIFICATE OF CORRECTION

| | | |
|---|---|---|
| PATENT NO. | : 8,089,278 B1 | Page 1 of 1 |
| APPLICATION NO. | : 12/422847 | |
| DATED | : January 3, 2012 | |
| INVENTOR(S) | : Jiang Du | |

It is certified that error appears in the above-identified patent and that said Letters Patent is hereby corrected as shown below:

On the Face Page, in Field (56), under "OTHER PUBLICATIONS", in Column 1, Line 7, delete "imging:" and insert -- imaging: --, therefor.

On Page 2, in Field (56), under "OTHER PUBLICATIONS", in Column 2, Line 3, delete "Neuroadiol," and insert -- Neuroradiol, --, therefor.

In Column 4, Line 10, delete "undersamplied" and insert -- undersampled --, therefor.

In Column 5, Line 43, delete "volummetric" and insert -- volumetric --, therefor.

In Column 7, Line 27, in Equation [2], delete "$=\rho C_j(x)$" and insert -- $=\Sigma C(x)$ --, therefor.

In Column 11, Line 30, delete "form" and insert -- from --, therefor.

In Column 11, Line 33, delete "artieral" and insert -- arterial --, therefor.

In Column 12, Line 1, delete "artieral" and insert -- arterial --, therefor.

In Column 12, Line 6, delete "mm3." and insert -- $mm^3$. --, therefor.

Signed and Sealed this
Seventh Day of August, 2012

David J. Kappos
*Director of the United States Patent and Trademark Office*